(12) United States Patent
Dennard et al.

(10) Patent No.: US 8,492,838 B2
(45) Date of Patent: Jul. 23, 2013

(54) ISOLATION STRUCTURES FOR SOI DEVICES WITH ULTRATHIN SOI AND ULTRATHIN BOX

(75) Inventors: Robert H. Dennard, Yorktown Heights, NY (US); Marwan H. Khater, Yorktown Heights, NY (US); Leathen Shi, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 12/618,871

(22) Filed: Nov. 16, 2009

(65) Prior Publication Data

US 2011/0115021 A1 May 19, 2011

(51) Int. Cl.
*H01L 27/01* (2006.01)
*H01L 27/12* (2006.01)
*H01L 31/0392* (2006.01)

(52) U.S. Cl.
USPC .................. 257/347; 257/524; 257/E27.112; 977/723

(58) Field of Classification Search
USPC .................. 257/347, 524, E27.112; 977/723
See application file for complete search history.

(56) References Cited

U.S. PATENT DOCUMENTS

| 5,466,630 | A | 11/1995 | Lur | |
|---|---|---|---|---|
| 6,509,613 | B1 * | 1/2003 | En et al. | 257/349 |
| 7,061,050 | B2 * | 6/2006 | Fazan et al. | 257/348 |
| 7,372,107 | B2 * | 5/2008 | Yeo et al. | 257/353 |
| 7,659,172 | B2 | 2/2010 | Neyfeh et al. | |
| 7,678,665 | B2 * | 3/2010 | Turner et al. | 438/436 |
| 2006/0186509 | A1 | 8/2006 | Larsen | |
| 2009/0057762 | A1 * | 3/2009 | Bangsaruntip et al. | 257/347 |
| 2010/0019322 | A1 | 1/2010 | Chen et al. | |

FOREIGN PATENT DOCUMENTS

EP 0336499 A1 10/1989

OTHER PUBLICATIONS

International Search Report dated Nov. 23, 2010 issued in corresponding International Application No. PCT/EP2010/064435.
Office Action dated Feb. 7, 2013 received in a related U.S. Appl. No. 13/566,568.

* cited by examiner

*Primary Examiner* — Howard Weiss
(74) *Attorney, Agent, or Firm* — Scully, Scott, Murphy & Presser, P.C.; Louis J. Percello, Esq.

(57) ABSTRACT

Shallow trenches are formed around a vertical stack of a buried insulator portion and a top semiconductor portion. A dielectric material layer is deposited directly on sidewalls of the top semiconductor portion. Shallow trench isolation structures are formed by filling the shallow trenches with a dielectric material such as silicon oxide. After planarization, the top semiconductor portion is laterally contacted and surrounded by the dielectric material layer. The dielectric material layer prevents exposure of the handle substrate underneath the buried insulator portion during wet etches, thereby ensuring electrical isolation between the handle substrate and gate electrodes subsequently formed on the top semiconductor portion.

14 Claims, 19 Drawing Sheets

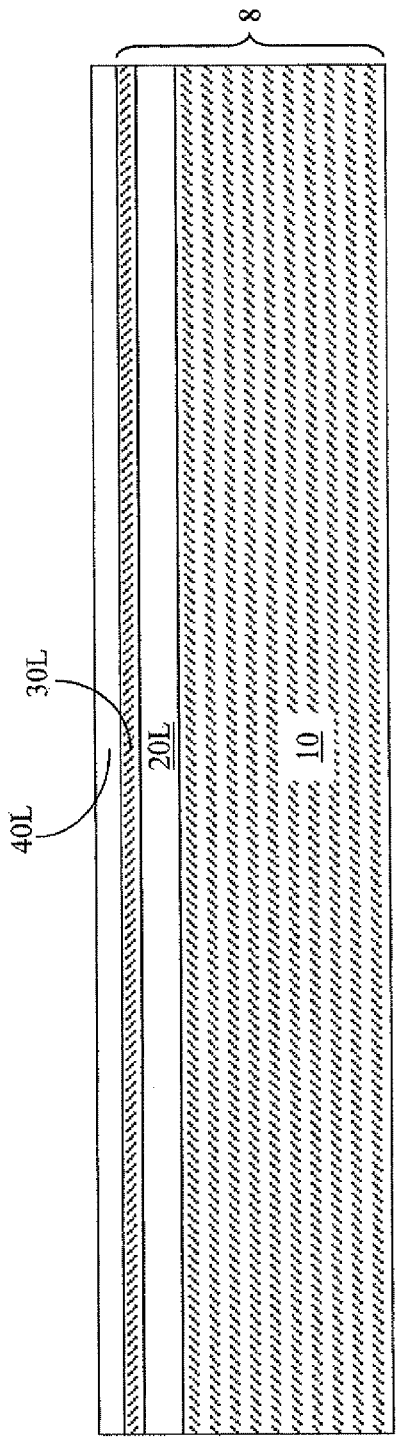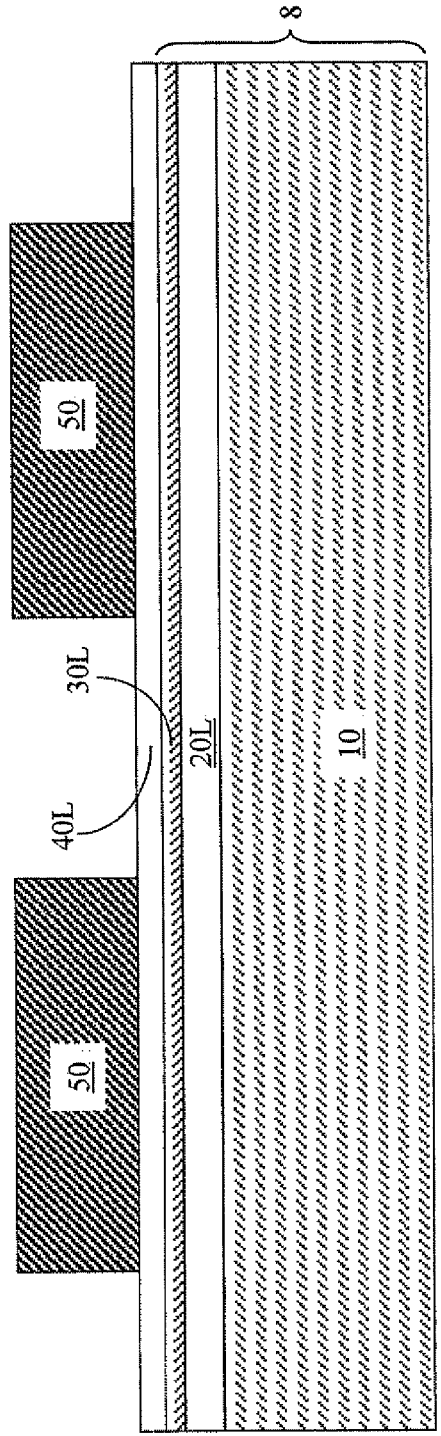

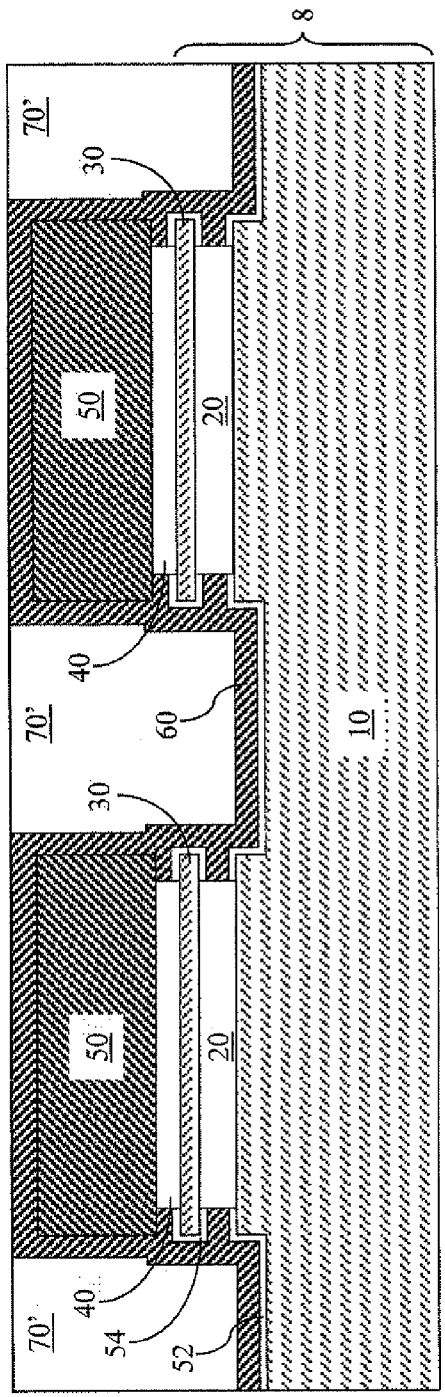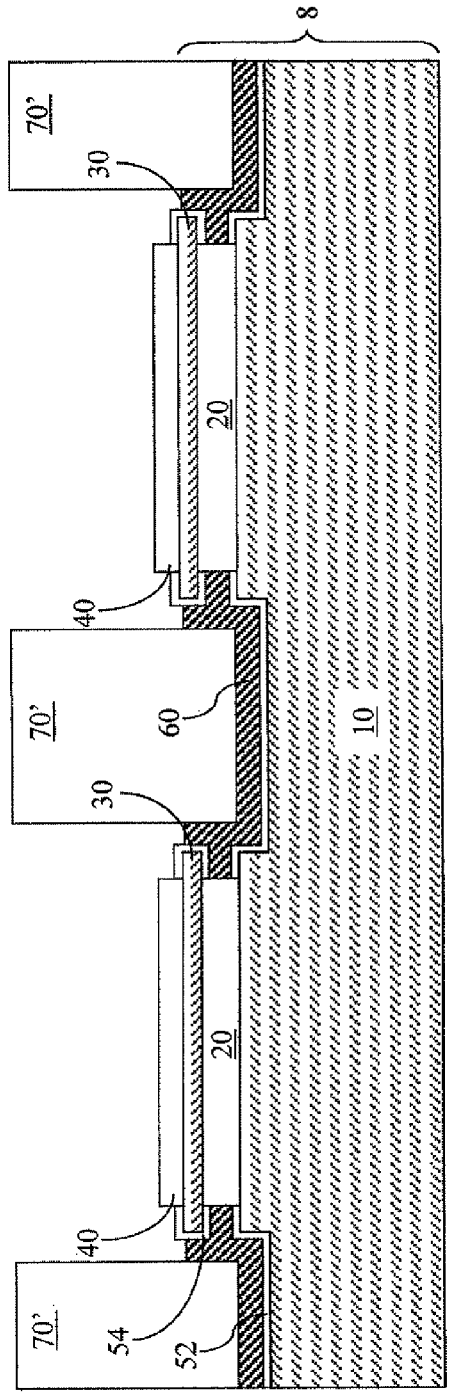
FIG. 7
FIG. 8

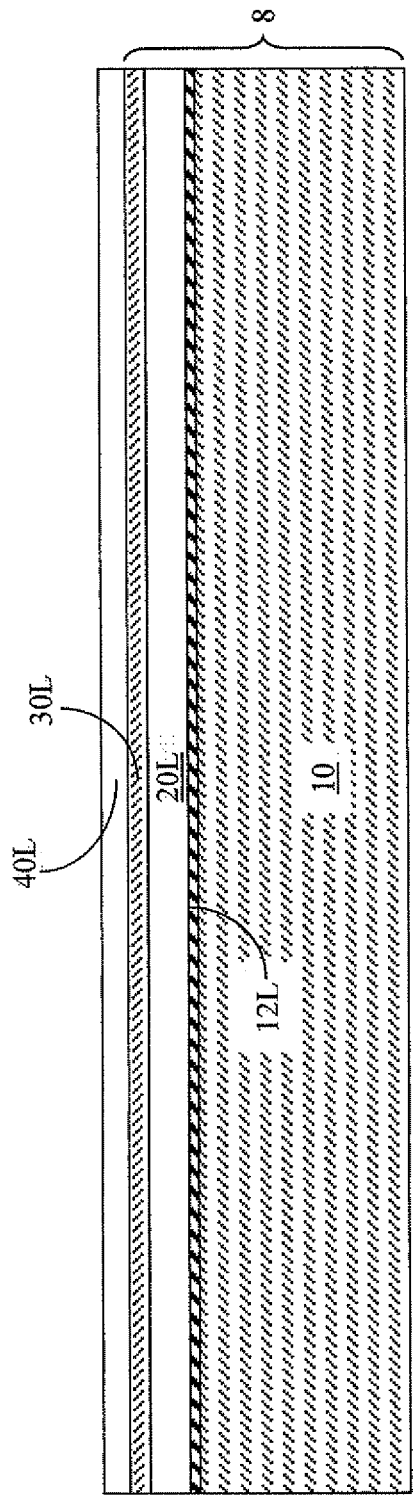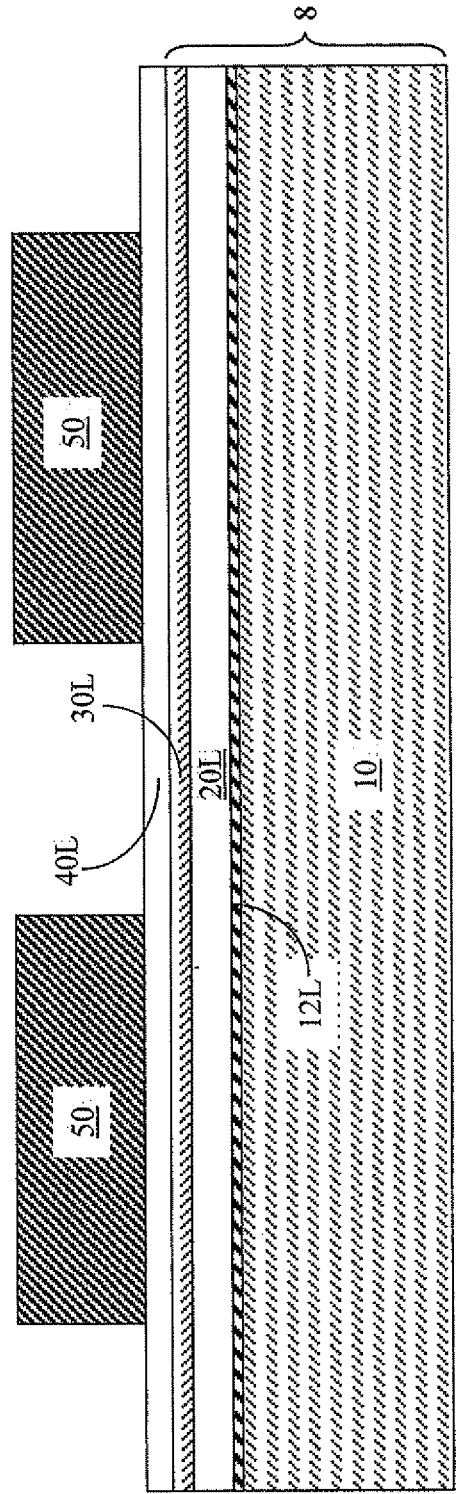

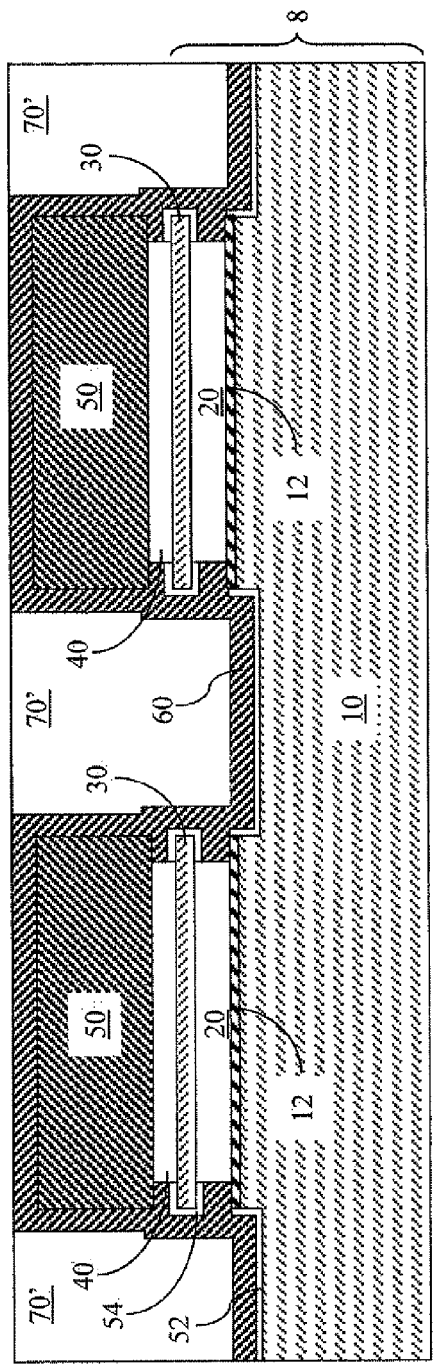
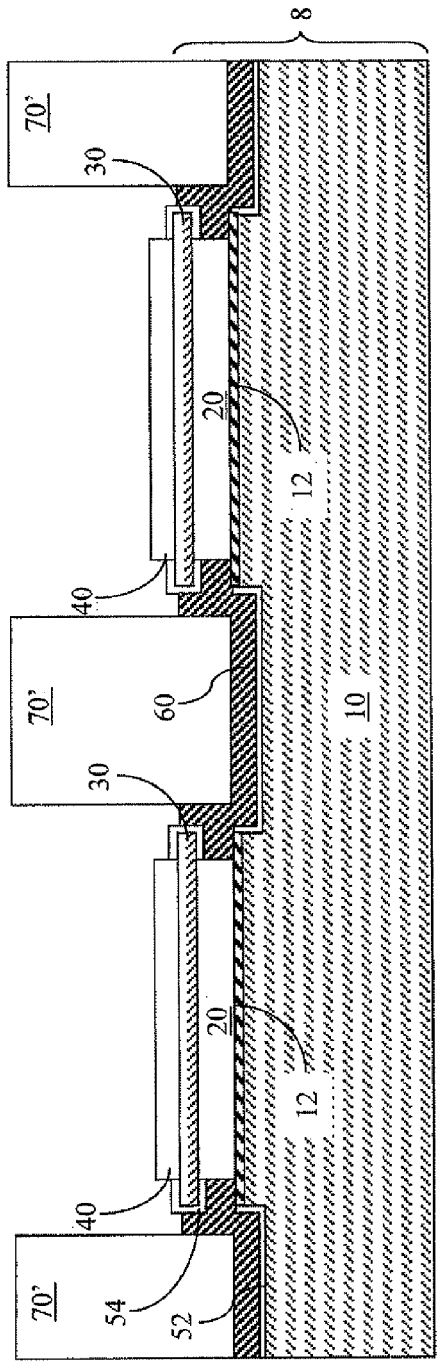
FIG. 17
FIG. 18

ISOLATION STRUCTURES FOR SOI DEVICES WITH ULTRATHIN SOI AND ULTRATHIN BOX

BACKGROUND

The present invention relates to semiconductor-on-insulator (SOI) structures, and particularly to SOT structures including a thin top semiconductor portion and a thin box laterally surrounded by a dielectric material layer and methods of manufacturing the same.

Advanced semiconductor-on-insulator (SOI) complementary metal-oxide-semiconductor (CMOS) circuits employ a thin top semiconductor layer, or a "semiconductor-on-insulator" (SOI) layer to provide enhanced performance. Further, a thin buried insulator can be employed to enable a backplate formed from an upper portion of a conductive handle substrate underneath the buried insulator layer. The backplate can be employed to bias the devices in the top semiconductor layer.

As the thicknesses of the top semiconductor layer and the buried insulator layer decrease, recesses in shallow trench isolation (STI) structures formed at an edge SOI CMOS devices can result in a leakage current in the SOI CMOS devices. Such a leakage current can result from a contact between a material of a gate structure with an active region of the SOI CMOS devices. Divots, i.e., recessed regions, at the edge of the active region is typically caused by wet etches, such as hydrofluoric acid (HF) etch, that are performed to clean the active silicon regions of the top semiconductor layer before forming gate structures.

In the case of back gate devices that employ a portion of the handle substrate as a backplate, a thin top semiconductor layer and a thin buried insulator layer are employed to maximize the effect of the back gate on SOI CMOS devices. The wet etches can form recesses that extend through the entire thickness of the buried insulator layer, exposing the material of the handle substrate. Deposition of the material for gate electrodes thereafter causes an electrical short between the backplate and the gate electrodes formed above the top semiconductor layer. However, electrical insulation between the backplate and the gate electrodes is necessary for functionality of the back gate devices.

BRIEF SUMMARY

According to an embodiment of the present invention, shallow trenches are formed around a vertical stack of a buried insulator portion and a top semiconductor portion. A dielectric material layer is deposited directly on sidewalls of the top semiconductor portion. Shallow trench isolation structures are formed by filling the shallow trenches with a dielectric material such as silicon oxide. After planarization, the top semiconductor portion is laterally contacted and surrounded by the dielectric material layer. The dielectric material layer prevents exposure of the handle substrate underneath the buried insulator portion during wet etches, thereby ensuring electrical isolation between the handle substrate and gate electrodes subsequently formed on the top semiconductor portion.

According to an aspect of the present invention, a semiconductor structure is provided, which includes a handle substrate including a first semiconductor material; a buried insulator portion located above the handle substrate; a semiconductor material portion including a second semiconductor material located on an upper surface of the buried insulator portion; and a dielectric material layer contacting and laterally surrounding sidewalls of the buried insulator portion, wherein a peripheral region of the semiconductor material portion laterally enclosing a center region of the semiconductor material portion overlies a portion of the dielectric material layer.

According to another aspect of the present invention, another semiconductor structure is provided, which includes a handle substrate including a first semiconductor material; a buried etch-resistant dielectric portion located on an upper surface of the handle substrate; a buried insulator portion located on the buried HF resistant dielectric portion; a semiconductor material portion including a second semiconductor material located on an upper surface of the buried insulator portion; and a dielectric material layer contacting and laterally surrounding the buried etch-resistant dielectric portion.

According to yet another aspect of the present invention, a method of forming a semiconductor structure is provided, which includes forming at least one trench in a semiconductor-on-insulator (SOI) substrate, whereby a vertical stack, from bottom to top, of a buried insulator portion and a semiconductor material portion is formed above a handle substrate; laterally recessing the buried insulator portion selective to the semiconductor material portion; forming a dielectric material layer directly on sidewalls of the buried insulator portion, wherein a peripheral region of the semiconductor material portion laterally enclosing a center region of the semiconductor material portion overlies a portion of the dielectric material layer; and forming at least one shallow trench isolation (STI) structure on the dielectric material layer.

According to still another aspect of the present invention, another method of forming a semiconductor structure is provided, which includes forming at least one trench in a semiconductor-on-insulator (SOI) substrate, whereby a vertical stack, from bottom to top, of a buried etch-resistant dielectric portion, a buried insulator portion, and a semiconductor material portion is formed above a handle substrate; forming a dielectric material layer directly on the buried etch-resistant dielectric portion and sidewalls of the buried insulator portion; and forming at least one shallow trench isolation (STI) structure on the dielectric material layer.

BRIEF DESCRIPTION OF THE SEVERAL VIEWS OF THE DRAWINGS

FIGS. 1-10 are sequential vertical cross-sectional views of a first exemplary semiconductor structure according to a first embodiment of the present invention.

FIGS. 11-20 are sequential vertical cross-sectional views of a second exemplary semiconductor structure according to a second embodiment of the present invention.

DETAILED DESCRIPTION

Figure 3:
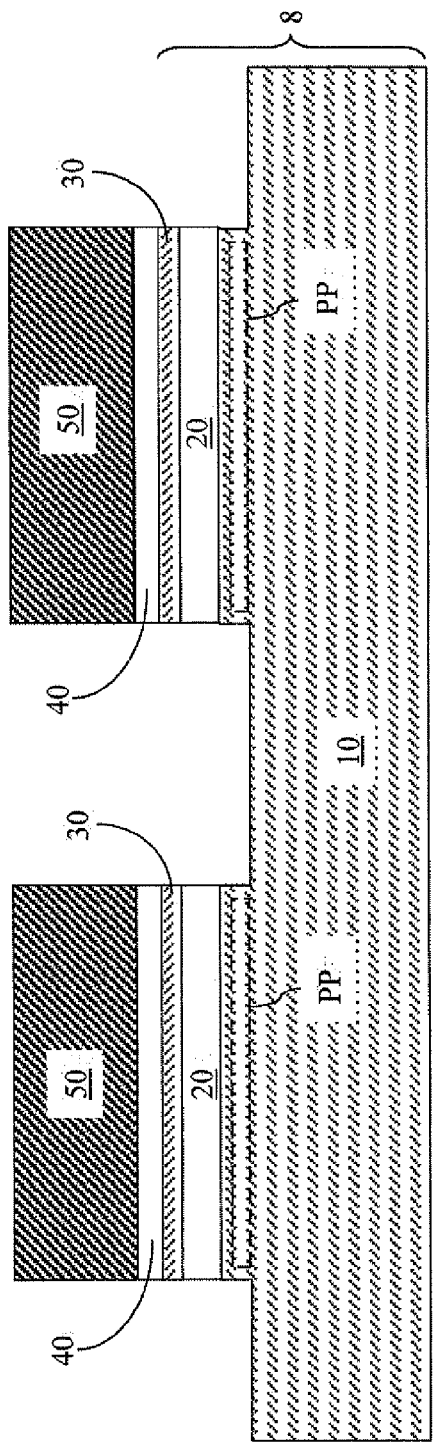

As stated above, the present invention relates to SOI structures including a thin top semiconductor portion and a thin box laterally surrounded by a dielectric material layer and methods of manufacturing the same, which are now described with accompanying figures. Throughout the drawings, the same reference numerals or letters are used to designate like or equivalent elements. The drawings are not necessarily drawn to scale.

As used herein, an "etch-resistant dielectric" or an "etch-resistant dielectric material," alone or in combination with any other term, refers to a dielectric material that is resistant to a wet etch or a plasma etch that removes thermal silicon oxide to a degree that provides an etch selectivity greater than 5.0 relative to thermal silicon oxide, i.e., a dielectric material that has an etch rate to the wet etch or plasma etch that is less than 20% of the etch rate of thermal silicon oxide to the wet etch or plasma etch.

As used herein, a "vertical direction" is a direction perpendicular to an upper surface of a substrate.

As used herein, a "lateral direction" is any direction perpendicular to a vertical direction.

As used herein, a periphery or sidewall of a first element is "vertically coincident with" a periphery or sidewall of a second element if said periphery or sidewall of said first element coincides with said periphery or sidewall of said second element in a see-through view along a vertical direction.

As used herein, a first element "vertically contacts" a second element if there is a direct physical contact between the first element and the second element in a vertical direction.

As used herein, a first element "laterally contacts" a second element if there is a direct physical contact between the first element and the second element in a lateral direction.

As used herein, sidewalls of a first element are "recessed inward" relative to sidewalls of a second element if the area enclosed by said sidewalls of said first element is located within the area enclosed by said sidewalls of said second element and the peripheries of the two areas are not vertically coincident with each other in a see-through view along a vertical direction.

As used herein, a first surface is "substantially coplanar with" a second surface if said first surface and said second surface are offset at most by a distance within controllability of a processing step intended to make said first surface and said second surface coplanar with each other or offset by an insignificant dimension in view of dimensional changes generated by said processing step.

As used herein, a first element "encapsulates" a second element if all outer surfaces of the second element are located within inner surfaces of the first element.

As used herein, two elements are "conductively connected" to each other if there exists a conductive path between the two elements to allow conduction of electricity.

As used herein, a "shallow trench isolation structure" is an isolation structure filling a contiguous trench and providing lateral electrical isolation between at least two elements that are laterally separated by said shallow trench isolation structure.

An element "abuts" another element when a physical interface area providing a direct contact is present between the element and the other element.

Referring to FIG. 1, a first exemplary semiconductor structure according to a first embodiment of the present invention includes a substrate 8 and a dielectric oxide layer 40L formed on a top surface thereof. The substrate 8 can be a semiconductor-on-insulator (SOI) substrate that includes a vertical stack, from bottom to top, of a handle substrate 10, a buried insulator layer 20L located above the handle substrate 10, and semiconductor material layer 30L, located on an upper surface of the buried insulator layer 20L.

The handle substrate 10 includes a first semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Further, the material of the handle substrate 10 can be a single crystalline, i.e., epitaxial, semiconductor material. For example, the handle substrate 10 can be a single crystalline silicon material. All or portions of the handle substrate 10 can be doped to provide at least one globally or locally conductive region (not shown) located beneath the interface between the handle substrate 10 and the buried insulator layer 20L. The dopant concentration in doped regions of the handle substrate 10 can be optimized for device performance. The thickness of the handle substrate 10 can be from 50 microns to 1 mm, although lesser and greater thicknesses can also be employed.

The buried insulator layer 20L is a layer of a dielectric material such as, but is not limited to, silicon oxide. A lower surface of the buried insulator layer 20L vertically contacts an upper surface of the handle substrate 10. The buried insulator layer 20L has a uniform thickness from 10 nm to 100 nm, and preferably from 20 nm to 40 nm, although lesser and greater thicknesses can also be employed. If the buried insulator layer 20L is composed of a dielectric oxide, the buried insulator layer 20L is a buried oxide layer. The lesser the thickness of the buried insulator layer 20L, the greater the effect of a bias voltage applied to a backplate subsequently formed in an upper portion of the handle substrate 10 on semiconductor devices formed above the buried insulator layer 20L.

The semiconductor material layer 30L includes a second semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Further, the material of the semiconductor material layer 30L can be a single crystalline, i.e., epitaxial, semiconductor material. For example, the semiconductor material layer 30L can be a single crystalline silicon material. All or portions of the semiconductor material layer 30L can be locally or globally doped with dopants of p-type and/or n-type as needed. A lower surface of the semiconductor material layer 30L vertically contacts an upper surface of the buried insulator layer 20L. The thickness of the semiconductor material layer 30L can be from 10 nm to 50 nm, although lesser and greater thicknesses can also be employed.

The dielectric oxide layer 40L is a layer of a dielectric oxide, and can be a silicon oxide layer. The dielectric oxide layer 40L can be formed by thermal conversion or plasma conversion of the semiconductor material of the semiconductor material layer 30L, or by deposition of a dielectric oxide, for example, by chemical vapor deposition (CVD). The thickness of the dielectric oxide layer 40L can be from 1 nm to 30 nm, and typically from 2 nm to 10 nm, although lesser and greater thicknesses can also be employed.

Referring to FIG. 2, an etch mask layer 50 is deposited over the dielectric oxide layer 40L and patterned. The etch mask layer 50 is a hard mask layer including a dielectric material that is not a photoresist. The etch mask layer 50 can include at least one material selected from dielectric nitrides of a semiconductor element, a dielectric metal nitride, and a dielectric metal oxide. The dielectric nitride of a semiconductor element includes, but is not limited to, silicon nitride. The dielectric metal nitride includes, but is not limited to, HfN and ZrN.

The dielectric metal oxide includes, but is not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. For example, the etch mask layer 50 can be a silicon nitride layer.

The etch mask layer 50 can be formed by depositing a blanket dielectric material layer, applying a photoresist thereupon, lithographically patterning the photoresist by lithographic exposure and development, and removing portions of the blanket dielectric material layer underneath openings in the photoresist employing an etch. The etch can be a dry etch such as anisotropic ion etch, or a wet etch. The remaining portions of the blanket dielectric material layer constitutes the etch mask layer 50. At least one active area covered by the etch mask layer 50 is defined upon formation of the etch mask layer 50. The thickness of the etch mask layer 50 can be from 10 nm to 200 nm, and typically from 20 nm to 100 nm, although lesser and greater thicknesses can also be employed.

Referring to FIG. 3, the pattern in the etch mask layer 50 is transferred into the dielectric oxide layer 40L, the semiconductor material layer 30L, the buried insulator layer 20L, and an upper portion of the handle substrate 10. At least one trench is formed by etching portions of the dielectric oxide layer 40L and the substrate 8 employing an etch mask layer 50. The remaining portions of the dielectric oxide layer 40L include at least one dielectric oxide portion 40, the remaining portions of the semiconductor material layer 30L include at least one semiconductor material portion 30, and the remaining portions of the buried insulator layer 20L include at least one buried insulator portion 20. While the present invention is hereafter described employing a single vertical stack of a buried insulator portion 20, a semiconductor material portion 30, and a dielectric oxide portion 40, embodiments in which multiple instances of such vertical stacks are formed on the handle substrate 10 are explicitly contemplated herein.

Within a vertical stack, an upper surface of the handle substrate 10 is parallel to an interface between the buried insulator portion 20 and the semiconductor material portion 30. The upper surface of the handle substrate 10 contacts the lower surface of the buried insulator portion 20. The etch proceeds into a portion of the handle substrate 10 and forms sidewalls of the handle substrate 10 that are adjoined to the upper surface of the handle substrate 10. A portion of the handle substrate 10 that is laterally surrounded by the sidewalls of the handle substrate 10 is herein referred to as a pedestal portion PP. The sidewalls of the buried insulator portion 20, the semiconductor material portion 30, and the dielectric oxide portion 40 are vertically coincident with sidewalls of a portion of the etch mask layer 50 and sidewalls of the pedestal portion PP underneath.

Figure 4:
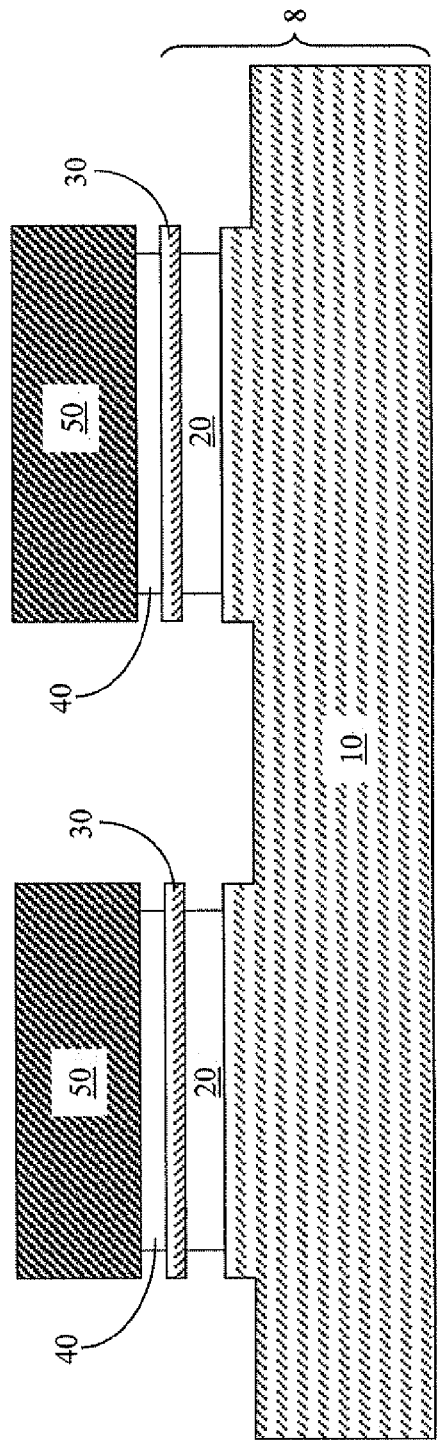

Referring to FIG. 4, the buried insulator portion 20 and the dielectric oxide portion 40 are laterally recessed, for example, by a wet etch. If the buried insulator portion 20 and the dielectric oxide portion 40 are composed of a same dielectric oxide material, the recessed sidewalls of the buried insulator portion 20 and the dielectric oxide portion 40 can be vertically coincident with each other. For example, the buried insulator portion 20 and the dielectric oxide portion 40 can be composed of silicon oxide. In this case, hydrofluoric acid (HF) can be employed to effect the lateral recess of the buried insulator portion 20 and the dielectric oxide portion 40.

After the lateral recess, the sidewalls of the buried insulator layer 20 and the dielectric oxide portion 40 are recessed inward relative to sidewalls of the semiconductor material portion 30. In other words, the periphery of the buried insulator layer 20 and the periphery of the dielectric oxide portion 40 are located entirely within the periphery of the semiconductor material portion 30 in a see-through view along a vertical direction that is perpendicular to the upper and lower surfaces of the semiconductor material portion 30.

Figure 5:
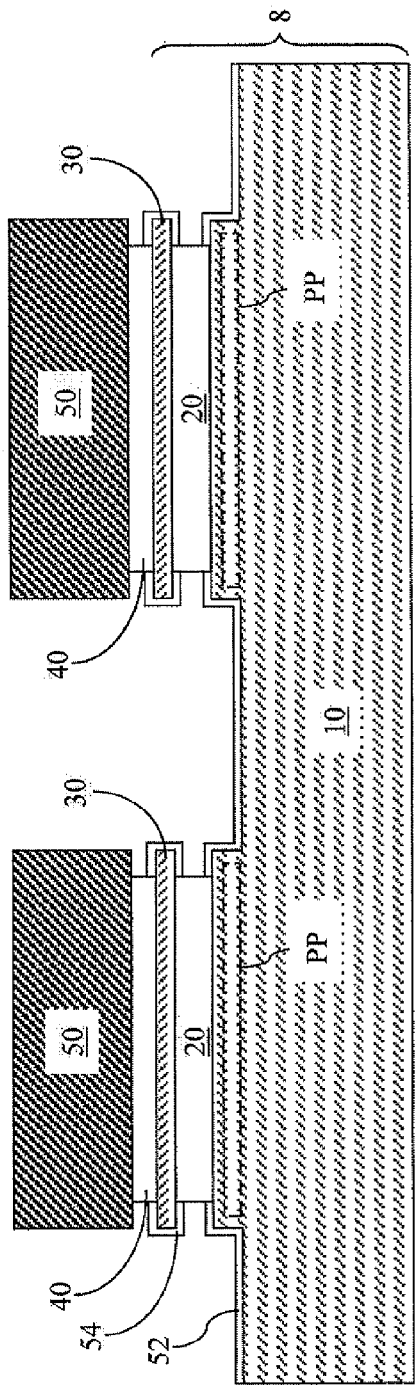

Referring to FIG. 5, a dielectric oxide-containing layer 52 is formed on exposed surfaces of the handle substrate 10 by conversion of exposed portions of the first semiconductor material of the handle substrate 10 to a dielectric material. This conversion can be effected by thermal conversion and/or plasma conversion. Specifically, the thermal conversion or the plasma conversion can be thermal oxidation, thermal nitridation, plasma oxidation, plasma nitridation, or a combination thereof. The dielectric oxide-containing layer 52 includes an oxide or an oxynitride of the first semiconductor material. For example, if the first semiconductor material includes silicon, the dielectric oxide-containing layer 52 can be a silicon oxide layer or a silicon oxynitride layer. The thickness of the dielectric oxide-containing layer 52 can be from 1 nm to 20 nm, and preferably from 2 nm to 6 nm, although lesser and greater thicknesses can also be employed.

Concurrently with the formation of the dielectric oxide-containing layer 52, at least one dielectric oxide-containing portion 54 is formed on exposed surfaces of each of the at least one semiconductor material portions 30. During the conversion process that forms the dielectric oxide-containing layer 52, the at least one dielectric oxide-containing portion 54 is formed by conversion of exposed portions of the second semiconductor material of the semiconductor material portion 30. The at least one dielectric oxide-containing portion 52 includes an oxide or an oxynitride of the second semiconductor material. For example, if the second semiconductor material includes silicon, each of the at least one dielectric oxide containing portion 54 can be a silicon oxide portion or a silicon oxynitride portion. The thickness of the at least one dielectric oxide-containing portion 54 can be from 1 nm to 20 nm, and preferably from 2 nm to 6 nm, although lesser and greater thicknesses can also be employed.

The conversion rate of the first and second semiconductor materials can be the same, for example, if the first and second semiconductor materials are the same. In this case, after formation of the dielectric oxide-containing layer 52 and the at least one dielectric oxide-containing portion 54, the sidewalls of the at least one semiconductor material portion 54 can be vertically coincident with sidewalls of the at least one pedestal portion PP of the handle substrate 10. The sidewalls of the at least one pedestal portion PP of the handle substrate 10 are adjoined to the upper surface of the handle substrate 10, i.e., the interface of the handle substrate 10 with the at least one buried insulator portion 20. Portions of sidewalls of the at least one buried insulator portion 20 and at least one dielectric oxide portion 40 are exposed after formation of the dielectric oxide-containing layer 52 and the at least one dielectric oxide-containing portion 54.

Figure 6:
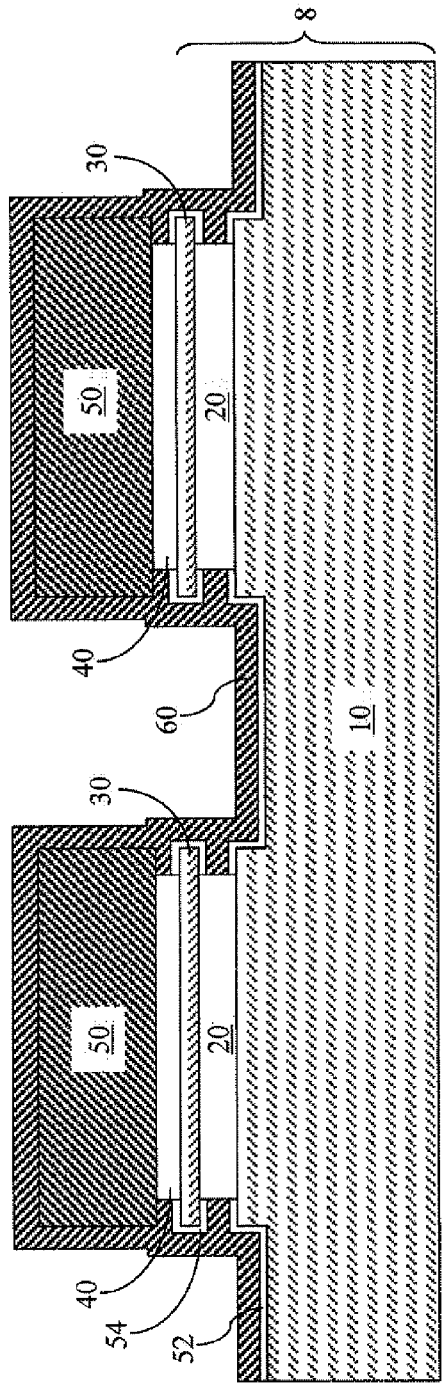

Referring to FIG. 6, a dielectric material layer 60 is formed directly on sidewalls of the at least one buried insulator portion 20, sidewalls of the at least one dielectric, oxide portion 40, surfaces of the dielectric oxide-containing layer 52, surfaces of the at least one dielectric oxide-containing portion 54, and the surfaces of the etch mask layer 50. The dielectric material layer 60 includes a dielectric material that is different from the materials of the dielectric oxide-containing layer 52 and the at least one dielectric oxide-containing portion 54. The dielectric material layer 60 can include at least one material selected from dielectric nitrides of a semiconductor element, a dielectric metal nitride, and a dielectric metal oxide. The dielectric nitride of a semiconductor element includes, but is not limited to, silicon nitride. The dielectric metal nitride includes, but is not limited to, HfN and ZrN. The dielectric metal oxide includes, but is not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the dielectric material layer 52 can be from 2 nm to 50 nm, and preferably from 4 nm to 20 nm, although lesser and greater thicknesses can also be employed.

The dielectric material layer 60 contacts and laterally surrounds sidewalls of the at least one buried insulator portion 20. The dielectric material layer 60 is spaced from the handle substrate 10 by the dielectric oxide-containing layer 52. Because each dielectric oxide portion 40 is laterally undercut below the etch mask layer 50, the dielectric material layer 60 underlies a peripheral portion of the etch mask layer 50. Because each buried insulator portion 20 is laterally undercut below a semiconductor material portion 30, the dielectric material layer underlies a peripheral portion of the semiconductor material portion 30.

Referring to FIG. 7, a silicon oxide material is deposited over the surfaces of the dielectric material layer 60 and planarized to form at least one prototype shallow trench isolation (STI) structure 70'. The silicon oxide material can be undoped silicate glass (USG) or a doped silicate glass having at least one dopant. The silicon oxide material can be deposited, for example, by chemical vapor deposition (CVD). The portion of the silicon oxide material above the top surfaces of the dielectric material layer 60 is removed by planarization, which can be effected by chemical mechanical planarization, recess etch, or a combination thereof. The top surfaces of the dielectric material layer 60 can be employed as a stopping layer. The at least one prototype shallow trench isolation (STI) structure 70' laterally surrounds each stack of a buried insulator portion 20, a semiconductor material portion 30, a dielectric oxide portion 40, and an isolated portion of the etch mask layer 50.

Referring to FIG. 5, the portion of the dielectric material layer 60 above the upper surface(s) of the at least one dielectric oxide portion 40 are removed selective to the at least one dielectric oxide portion 40. For example, if the dielectric material layer 60 and the etch mask layer 50 include silicon nitride and the at least one dielectric oxide portion 40 includes silicon oxide, hot phosphoric acid and/or plasma etch can be employed to remove silicon nitride selective to silicon oxide. An overetch may recess the exposed surfaces of the dielectric material layer 60 below the upper surface(s) of the at least one dielectric oxide portion. Preferably, the exposed surfaces of the dielectric material layer 60 are located above the interface between the at least one buried insulator portion 20 and the at least one semiconductor material portion 30.

Figure 9:
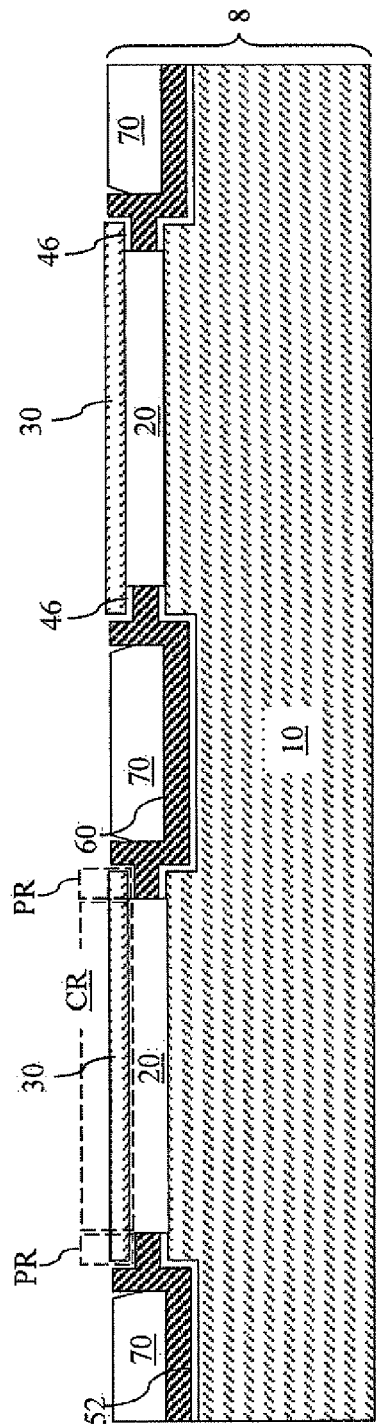

Referring to FIG. 9, the at least one prototype shallow trench isolation (STI) structure 70' is recessed by a wet etch employing hydrofluoric acid (HF) and/or plasma etch. The etch process removes the upper portions of the at least one prototype shallow trench isolation (STI) structure 70' selective to the material of the dielectric material layer 60. Preferably, the dielectric material layer is composed of an etch-resistant dielectric material having an etch selectivity greater than 5.0 relative to thermal silicon oxide in a wet etch employing hydrofluoric acid (HF). The remaining portion of the at least one prototype shallow trench isolation (STI) structure 70' constitutes at least one shallow trench isolation (STI) structure 70.

The dielectric material layer 60 contacts and laterally surrounds sidewalls of the at least one buried insulator portion 20. A peripheral region PR of each semiconductor material portion 30 laterally encloses a center region CR of the semiconductor material portion 30. The peripheral region PR overlies a portion of the dielectric material layer 60.

The at least one shallow trench isolation (STI) structure 70 is laterally spaced from the at least one buried insulator portion 20 and the at least one semiconductor material portion 30 by the dielectric material layer 60. Further, the at least one shallow trench isolation (STI) structure 70 is vertically spaced from the handle substrate 10 by the dielectric oxide-containing layer 52 and the dielectric material layer 60. The upper surface of the at least one STI structure 70 can be substantially coplanar with an upper surface of the at least one semiconductor material portion 30.

Figure 10:
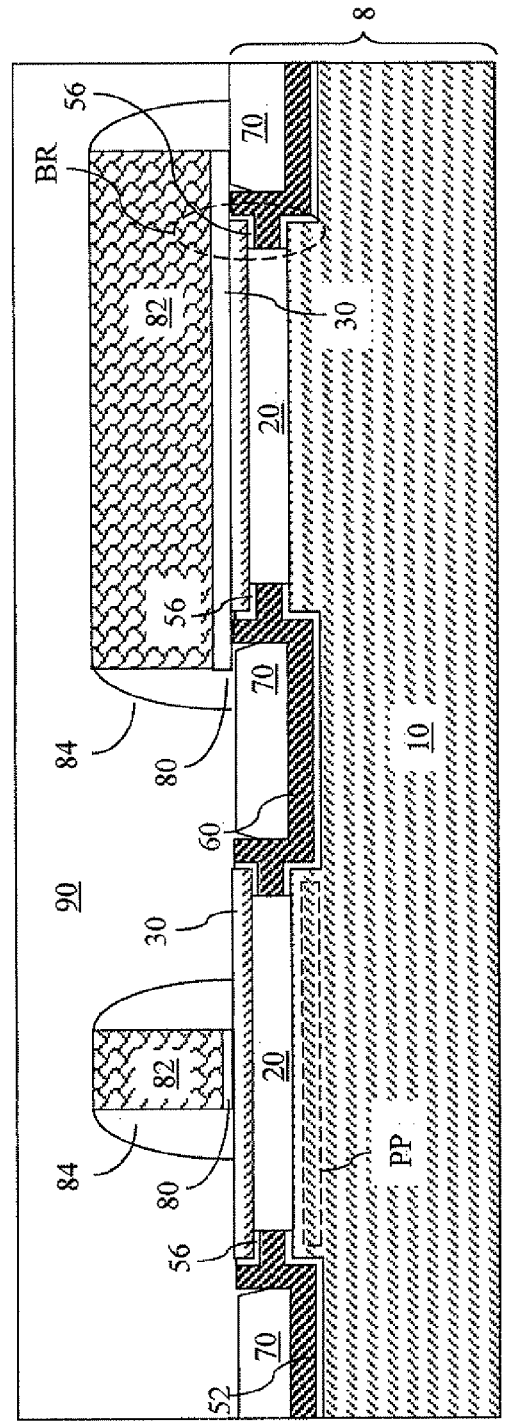

Referring to FIG. 10, gate dielectrics 80 and gate electrodes 82 are formed on the upper surface(s) of the at least one semiconductor material portion 30. Source and drain regions (not shown) can be formed in the at least one semiconductor material portion 30. Dielectric gate spacers 84 can be formed as needed to offset various portions of the source and drain regions from the sidewalls of the gate electrodes 82. A contact-level dielectric layer 90 is deposited over the gate electrodes 82 and the at least one semiconductor material portion 30. A backside contact structure (not shown) that contacts the handle substrate 10 and extending above a horizontal plane of an upper surface of the at least one semiconductor material portion 30 can be formed to provide an electrical bias to a backplate as known in the art. The backplate is an upper portion of the handle substrate 10 that includes a pedestal portion PP. The backplate functions as a back gate of semiconductor-on-insulator (SOI) devices and modulates the device characteristics.

Referring to FIG. 11, a second exemplary semiconductor structure according to a second embodiment of the present invention includes a substrate 8 and a dielectric oxide layer 40L formed on a top surface thereof. The substrate 8 can be a semiconductor-on-insulator (SOI) substrate that includes a vertical stack, from bottom to top, of a handle substrate 10, a buried etch-resistant dielectric layer 12L, a buried insulator layer 20L located above the buried etch-resistant dielectric layer 12L, and semiconductor material layer 30L located on an upper surface of the buried insulator layer 20L. Each of the handle substrate 10, the buried insulator layer 20L, and the semiconductor material layer 30L can have the same thickness, the same compositional characteristics, and the same structural characteristics as in the first exemplary semiconductor structure except that the buried etch-resistant dielectric layer 12L is located between the handle substrate 10 and the buried insulator layer 20L. The dielectric oxide layer 40L has the same compositional and structural characteristics as in the first exemplary semiconductor structure.

The buried etch-resistant dielectric layer 12L is a layer of an etch-resistant dielectric material. The buried etch-resistant dielectric layer 12L includes at least one material selected from dielectric nitrides of a semiconductor element, a dielectric metal nitride, and a dielectric metal oxide. The dielectric nitride of a semiconductor element includes, but is not limited to, silicon nitride. The dielectric metal nitride includes, but is not limited to, HfN and ZrN. The dielectric metal oxide includes, but is not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. For example, the buried etch-resistant dielectric layer 12 can be a silicon nitride layer.

Referring to FIG. 12, an etch mask layer 50 is formed on the upper surface of the dielectric oxide layer 40L in the same manner as in the first embodiment.

Figure 13:
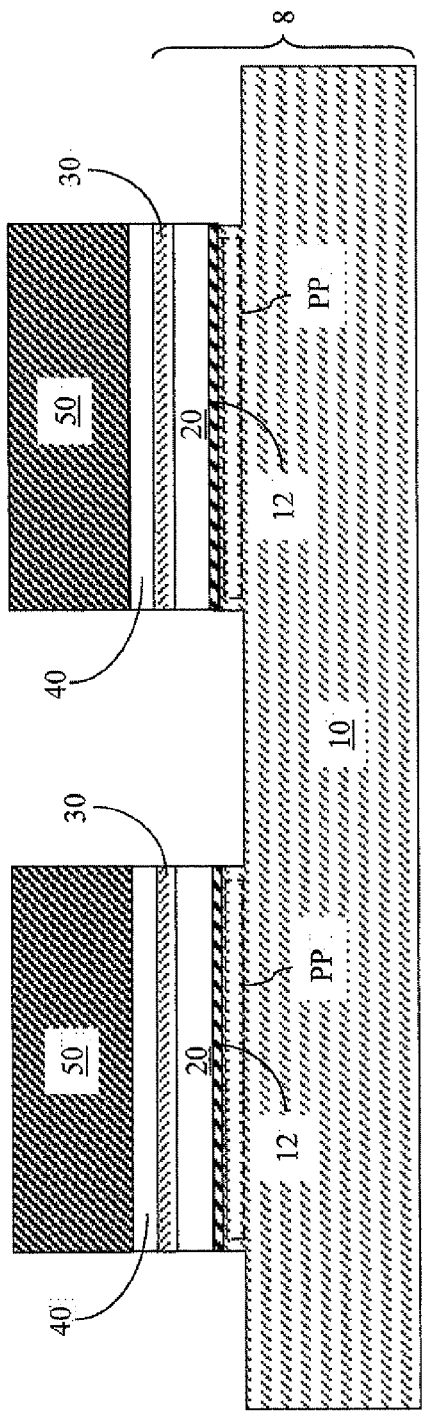

Referring to FIG. 13, the pattern in the etch mask layer 50 is transferred into the dielectric oxide layer 40L, the semiconductor material layer 30L, the buried insulator layer 20L, the buried etch-resistant dielectric layer 12L, and an upper portion of the handle substrate 10. At least one trench is formed by etching portions of the dielectric oxide layer 40L and the substrate 8 employing an etch mask layer 50. The remaining portions of the dielectric oxide layer 40L include at least one dielectric oxide portion 40, the remaining portions of the semiconductor material layer 30L include at least one semiconductor material portion 30, the remaining portions of the buried insulator layer 20L include at least one buried insulator portion 20, and the remaining portions of the etch-resistant dielectric layer 12L include an etch-resistant dielectric portion 12. While the present invention is hereafter described employing a single vertical stack of an etch-resistant dielectric portion 12, a buried insulator portion 20, a semiconductor material portion 30, and a dielectric oxide portion 40, embodiments in which multiple instances of such vertical stacks are formed on the handle substrate 10 are explicitly contemplated herein.

Within a vertical stack, an upper surface of the handle substrate 10 is parallel to an interface between the buried insulator portion 20 and the semiconductor material portion 30. The upper surface of the handle substrate 10 contacts the lower surface of the etch-resistant dielectric portion 12. The upper surface of the etch-resistant dielectric portion 12 contacts the lower surface of the buried insulator portion 20. The etch proceeds into a portion of the handle substrate 10 and forms sidewalls of the handle substrate 10 that are adjoined to the upper surface of the handle substrate 10. A portion of the handle substrate 10 that is laterally surrounded by the sidewalls of the handle substrate 10 is herein referred to as a pedestal portion PP. The sidewalls of the etch-resistant dielectric portion 12, the buried insulator portion 20, the semiconductor material portion 30, and the dielectric oxide portion 40 are vertically coincident with sidewalls of a portion of the etch mask layer 50 and sidewalls of the pedestal portion PP underneath.

Figure 14:
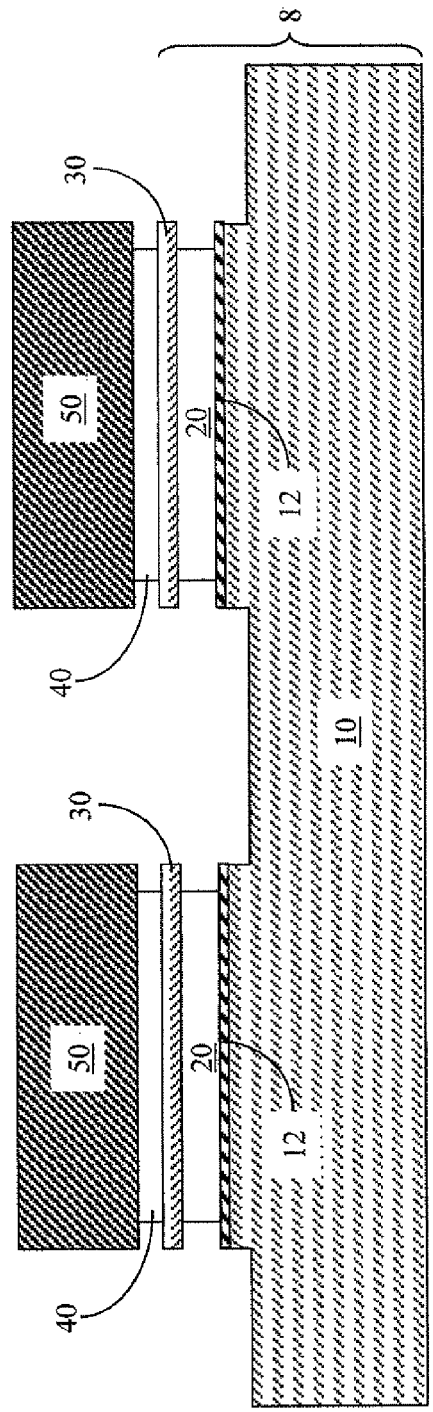

Referring to FIG. 14, the buried insulator portion 20 and the dielectric oxide portion 40 are laterally recessed in the same manner as in the first embodiment. After the lateral recess, the sidewalls of the buried insulator layer 20 and the dielectric oxide portion 40 are recessed inward relative to sidewalls of the semiconductor material portion 30.

Figures 15, 16:
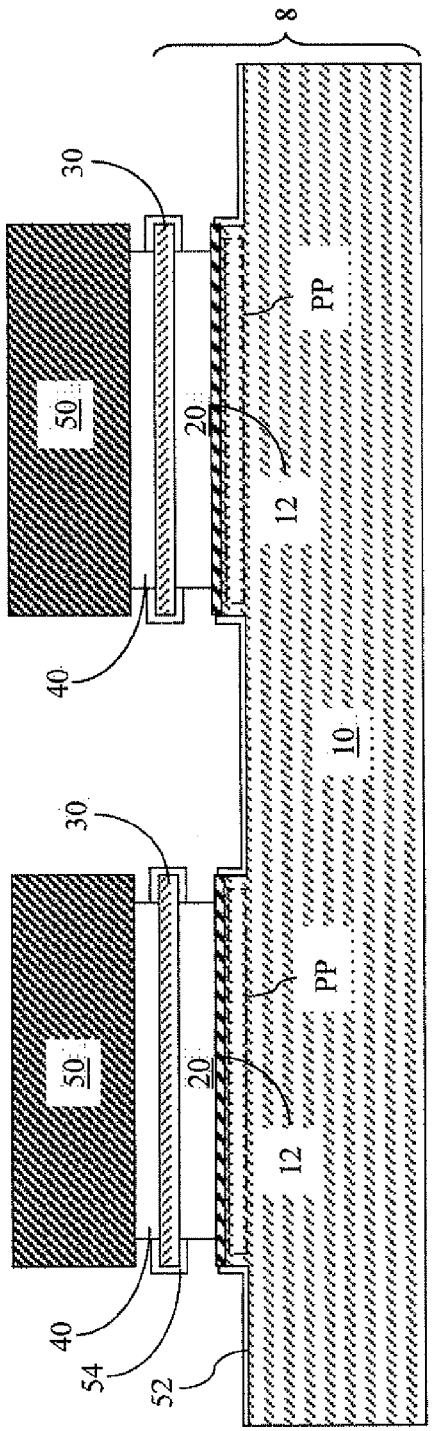

Referring to FIG. 15, a dielectric oxide-containing layer 52 is formed on exposed surfaces of the handle substrate 10 and at least one dielectric oxide-containing portion 54 is formed on exposed surfaces of each of the at least one semiconductor material portions 30 in the same manner as in the first embodiment. Because of the presence of the etch-resistant dielectric portion 12, the dielectric oxide-containing layer 52 does not contact any of the at least one buried insulator portion 20. Portions of sidewalls of the at least one buried insulator portion 20 and at least one dielectric oxide portion 40 are exposed after formation of the dielectric oxide-containing layer 52 and the at least one dielectric oxide-containing portion 54. The sidewalls of the at least one semiconductor material portion 30 are vertically coincident with sidewalls of the at least one pedestal portion PP of the handle substrate 10. The sidewalls of the at least one pedestal portion PP are adjoined to an upper surface of the handle substrate 10, i.e., adjoined to the interface between the handle substrate 10 and the at least one etch-resistant dielectric portion 12.

Referring to FIG. 16, a dielectric material layer 60 is formed directly on exposed surfaces of the at least one etch-resistant dielectric portion 12, sidewalls of the at least one buried insulator portion 20, sidewalls of the at least one dielectric oxide portion 40, surfaces of the dielectric oxide-containing layer 52, surfaces of the at least one dielectric oxide-containing portion 54, and the surfaces of the etch mask layer 50. The dielectric material layer 60 can have the same composition and the same thickness as in the first embodiment. The dielectric material layer 60 contacts a peripheral portion of each etch-resistant dielectric portion 12. The dielectric material layer 60 contacts and laterally surrounds sidewalls of the at least one buried insulator portion 20. The dielectric material layer 60 is spaced from the handle substrate 10 by the dielectric oxide-containing layer 52. Because each dielectric oxide portion 40 is laterally undercut below the etch mask layer 50, the dielectric material layer 60 underlies a peripheral portion of the etch mask layer 50. Because each buried insulator portion 20 is laterally undercut below a semiconductor material portion 30, the dielectric material layer underlies a peripheral portion of the semiconductor material portion 30. Portions of the dielectric material layer 60 underlie a peripheral portion of each semiconductor material portion 30.

Referring to FIG. 17, a silicon oxide material is deposited over the surfaces of the dielectric material layer 60 and planarized to form at least one prototype shallow trench isolation (STI) structure 70' in the same manner as in the first embodiment.

Referring to FIG. 18, the portion of the dielectric material layer 60 above the upper surface(s) of the at least one dielectric oxide portion 40 are removed selective to the at least one dielectric oxide portion 40 in the same manner as in the first embodiment.

Figure 19:
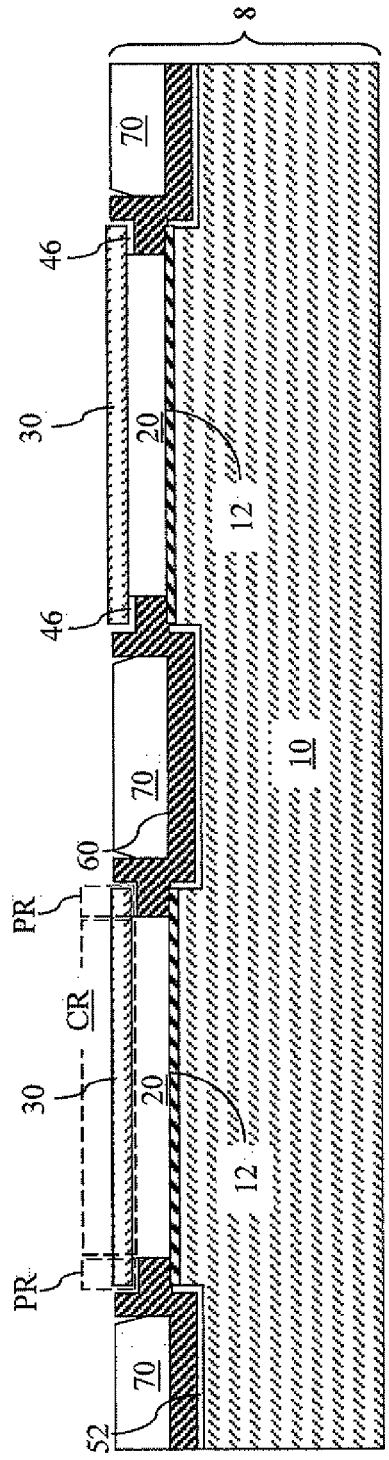

Referring to FIG. 19, the at least one prototype shallow trench isolation (STI) structure 70' is recessed by a wet etch employing hydrofluoric acid (HF) and/or plasma etch in the same manner as in the first embodiment. The overlap between the peripheral region PR and the portion of the dielectric material layer 60 underneath has the effect of retarding the encroachment of the hydrofluoric acid toward the buried insulator portion. Thus, the first exemplary semiconductor structure reduces the extent of encroachment into the at least one buried insulator portion by the at least one cavity 46.

Further, the presence of the at least one etch-resistant dielectric portion 12 provides further protection against exposure of the material of the handle substrate 10 because the material of the at least one etch-resistant dielectric portion 12 is resistant to hydrofluoric acid.

Figure 20:
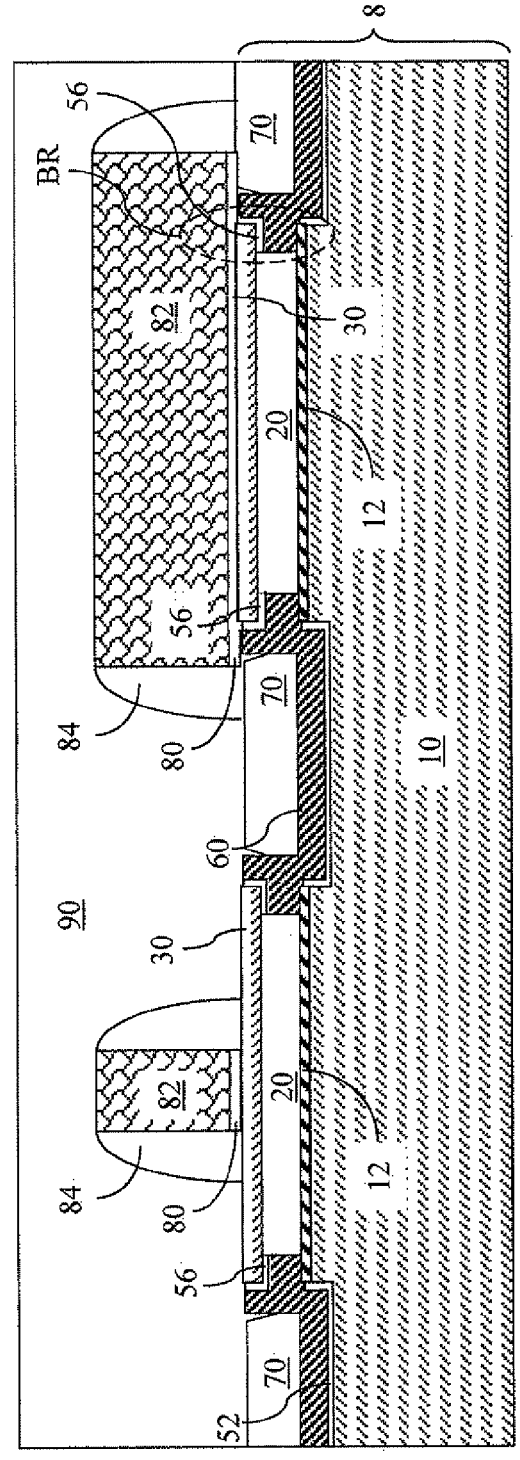

Referring to FIG. 20, gate dielectrics 80 and gate electrodes 82 are formed on the upper surface(s) of the at least one semiconductor material portion 30 as in the first embodiment. Source and drain regions (not shown), optional dielectric gate spacers 84, a contact-level dielectric layer 90, and/or a backside contact structure (not shown) can be formed as in the first embodiment.

Figure 21:
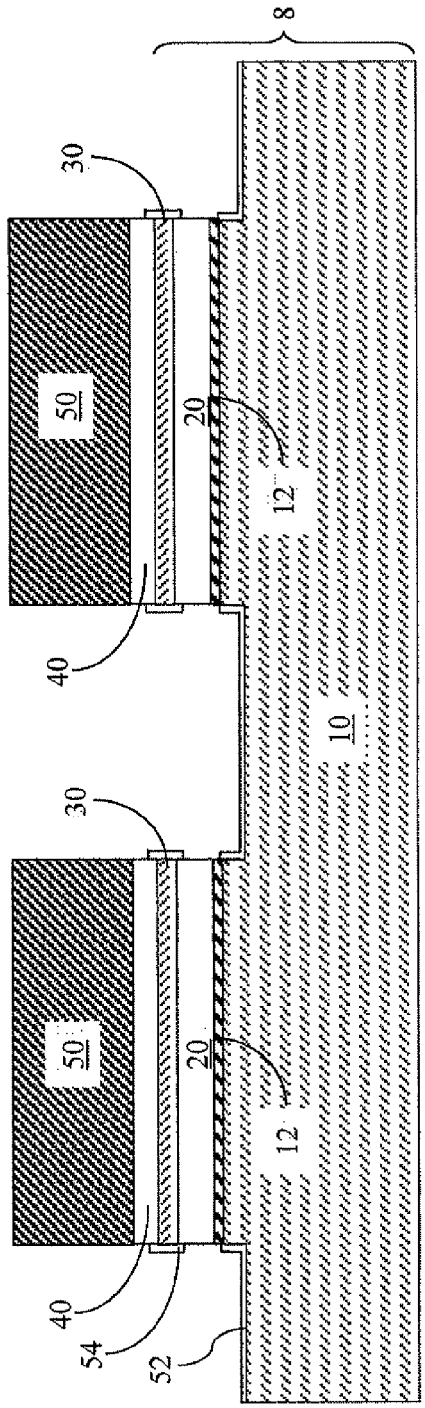
FIGS. 21-24 are sequential vertical cross-sectional views of a third exemplary semiconductor structure according to a third embodiment of the present invention.

Referring to FIG. 21, a third exemplary semiconductor structure according to a third embodiment of the present invention is derived from the second exemplary semiconductor structure of FIG. 13 by forming a dielectric oxide-containing layer 52 on exposed surfaces of the handle substrate 10 and at least one dielectric oxide-containing portion 54 on exposed surfaces of each of the at least one semiconductor material portion 30. The dielectric oxide-containing layer 52 and the at least one dielectric oxide-containing portion 54 are formed without performing any lateral recessing of the at least one buried insulator portion 20 and at least one dielectric oxide portion 40. Therefore, sidewalls of the at least one buried insulator portion 20 are vertically coincident with sidewalls of the at least one semiconductor material portion 40. Preferably, the dielectric oxide-containing layer 52 does not contact the sidewalls of the at least one buried insulator portion 20.

Figure 22:
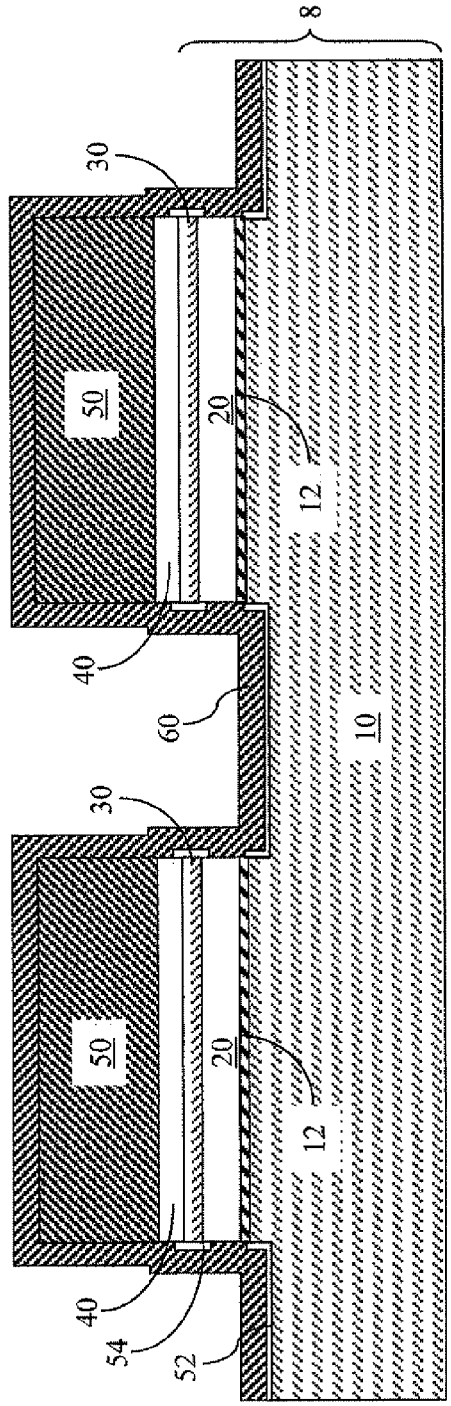

Referring to FIG. 22, a processing step corresponding to the processing step of FIG. 16 is performed to form a dielectric material layer 60 directly on exposed surfaces of the at least one etch-resistant dielectric portion 12, sidewalls of the at least one buried insulator portion 20, sidewalls of the at least one dielectric oxide portion 40, surfaces of the dielectric oxide-containing layer 52, surfaces of the at least one dielectric oxide-containing portion 54, and the surfaces of the etch mask layer 50.

Figure 23:
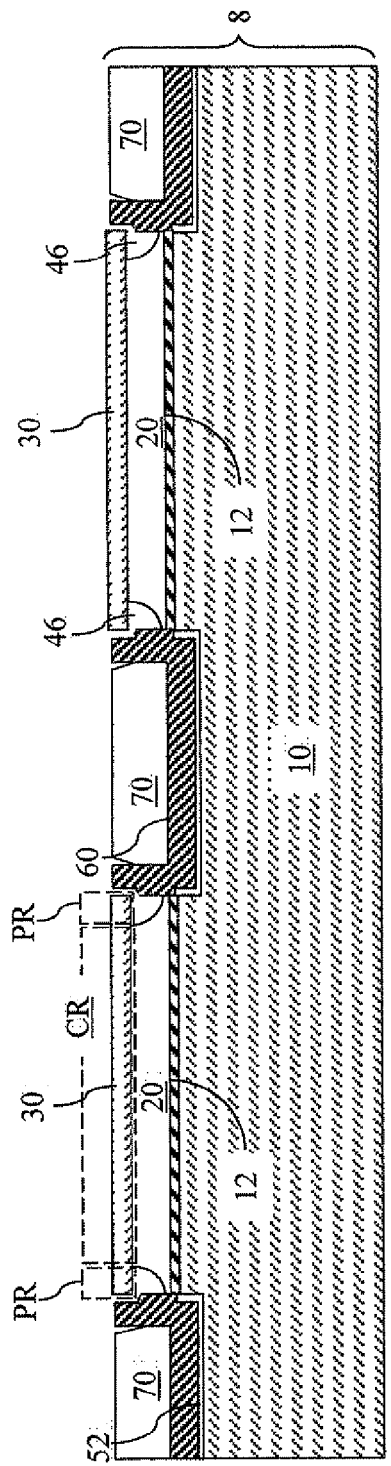

Referring to FIG. 23, processing steps corresponding to the processing steps of FIGS. 17-19 of the second embodiment are performed. The sidewalls of each of the at least one etch-resistant dielectric portion 12 laterally contacts sidewalls of the dielectric material layer 60. The at least one etch-resistant dielectric portion 12 and the dielectric material layer 60 collectively form a contiguous layer that separates, and protects from etch, the handle substrate 10 from the at least one buried insulator portion 20 and the at least one STI structure 70. Further, the contiguous layer including at least one etch-resistant dielectric portion 12 and the dielectric material layer 60 protects the handle substrate 10 from any etch that may remove a portion of the at least one buried insulator portion 20 and/or the at least one STI structure 70.

In the third exemplary semiconductor structure, there is no overlap between the peripheral region PR of a semiconductor material portion 30 and the dielectric material layer 60. The presence of the at least one etch-resistant dielectric portion 12 provides protection against exposure of the material of the handle substrate 10 because the material of the at least one etch-resistant dielectric portion 12 is resistant to hydrofluoric acid even if the at least one cavity 46 reaches a top surface of the at least one etch-resistant dielectric portion 12.

Figure 24:
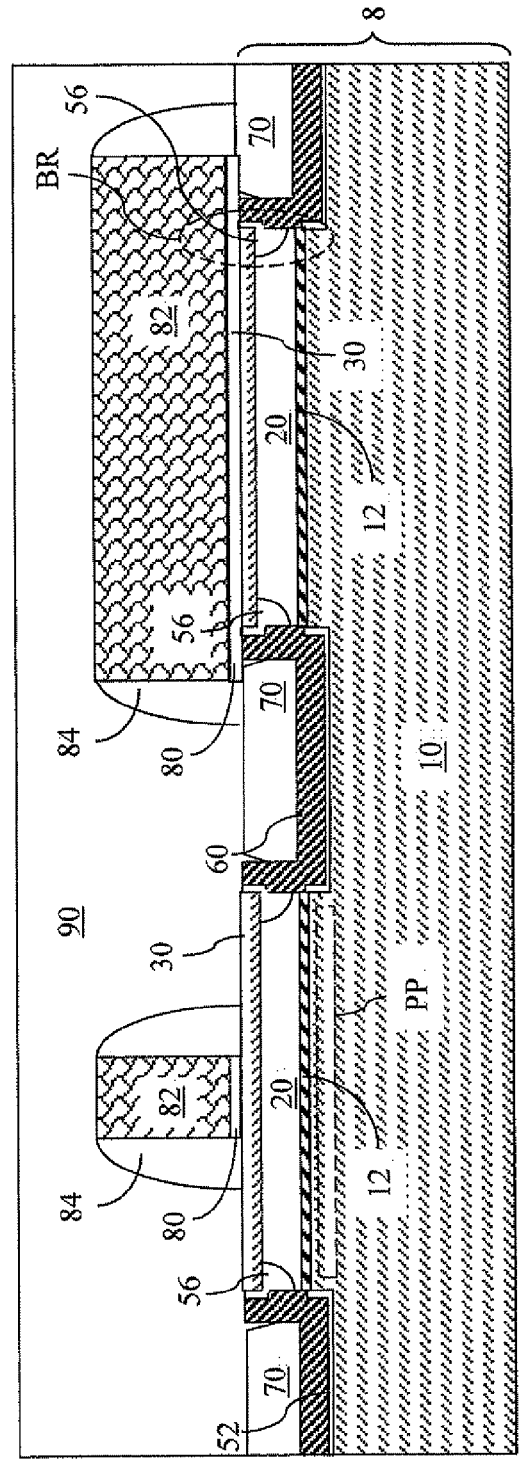

Referring to FIG. 24, gate dielectrics 80 and gate electrodes 82 are formed on the upper surface(s) of the at least one semiconductor material portion 30 as in the second embodiment. Source and drain regions (not shown), optional dielectric gate spacers 84, a contact-level dielectric layer 90, and/or a backside contact structure (not shown) can be formed as in the second embodiment.

The third exemplary semiconductor structure is a modification of the second exemplary semiconductor structure in which the lateral overlap between peripheral portions of the at least one semiconductor material region 30 and the dielectric material layer 60 is eliminated by omission of the lateral etch corresponding to the processing step of FIG. 14 of the second embodiment. Sidewalls of each pedestal portion PP of the handle substrate 10 are vertically coincident with sidewalls of a etch-resistant dielectric portion 12 and sidewalls of a semiconductor material portion 30.

Figure 25:
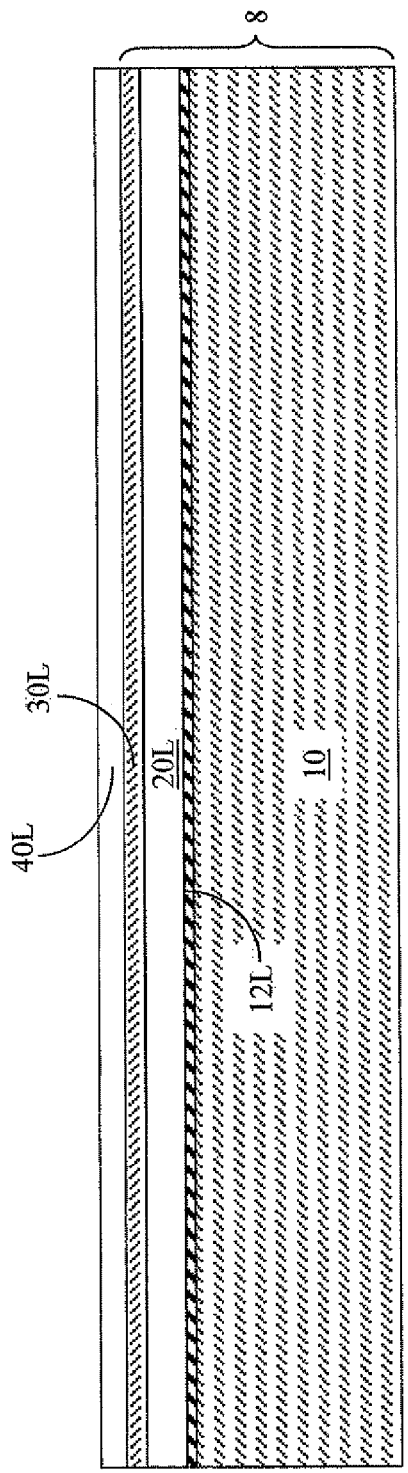
FIGS. 25-33 are sequential vertical cross-sectional views of a fourth exemplary semiconductor structure according to a fourth embodiment of the present invention.

Referring to FIG. 25, a fourth exemplary semiconductor structure according to a fourth embodiment of the present invention is identical to the second exemplary semiconductor structure of FIG. 11.

Figure 26:
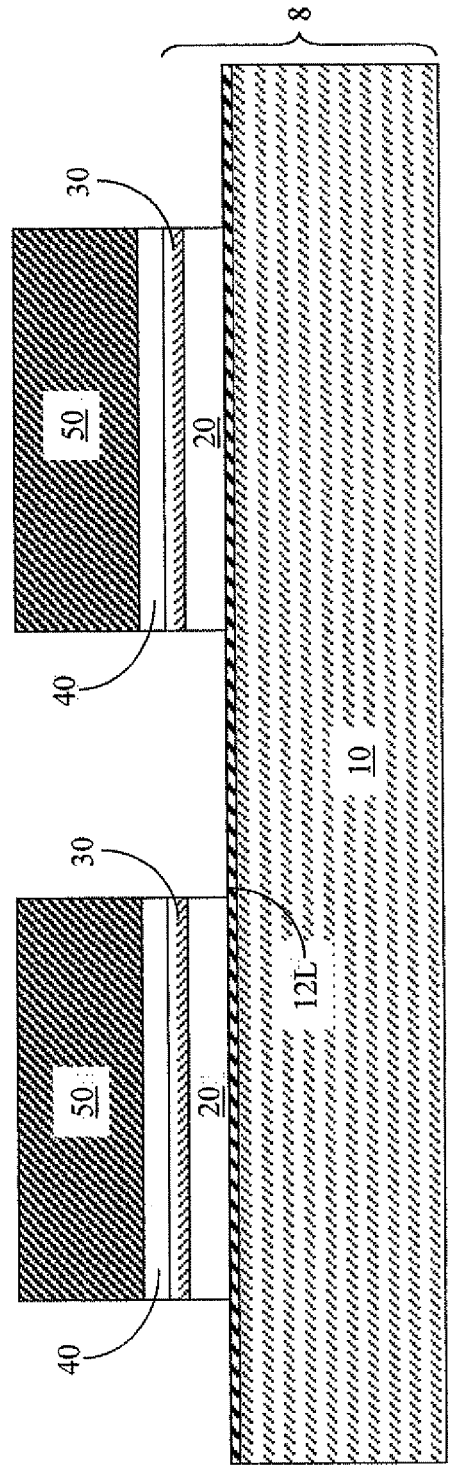

Referring to FIG. 26, an etch mask layer 50 is formed on the upper surface of the dielectric oxide layer 40L in the same manner as in the second embodiment. The pattern in the etch mask layer 50 is transferred into the dielectric oxide layer 40L, the semiconductor material layer 30L, and the buried insulator layer 20L by an etch, which can be an anisotropic etch such as a reactive ion etch. The buried etch-resistant dielectric layer 12L is employed as a stopping layer of the etch. At least one trench is formed above the buried etch-resistant dielectric layer 12L. The remaining portions of the dielectric oxide layer 40L include at least one dielectric oxide portion 40, the remaining portions of the semiconductor material layer 30L include at least one semiconductor material portion 30, and the remaining portions of the buried insulator layer 20L include at least one buried insulator portion 20. While the present invention is hereafter described employing a single vertical stack of a buried insulator portion 20, a semiconductor material portion 30, and a dielectric oxide portion 40, embodiments in which multiple instances of such vertical stacks are formed on the handle substrate 10 are explicitly contemplated herein.

Figure 27:
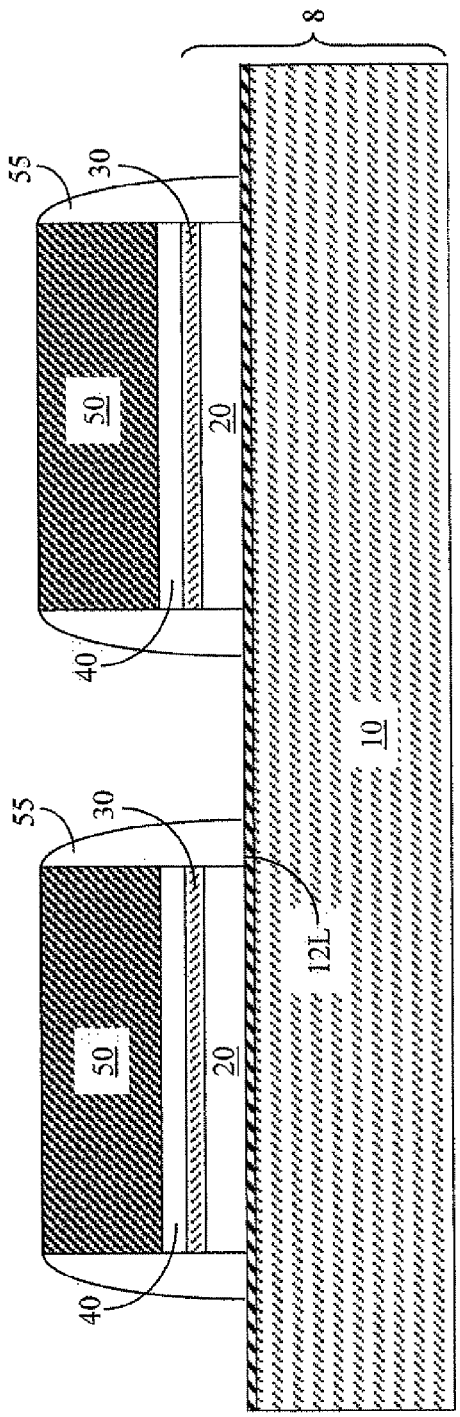

Referring to FIG. 27, at least one spacer 55 is formed on sidewalls of the at least one semiconductor material portion 30 and the at least one buried insulator portion 20 after forming the at least one trench. The at least one spacer 55 can be formed by deposition of a conformal layer, followed by an anisotropic etch that removes horizontal portions of the conformal layer. Preferably, the at least one spacer 55 includes a material, relative to which the material of the buried etch-resistant dielectric layer 12L can be selectively etched. For example, the at least one spacer 55 can include silicon oxide. The thickness of the at least one spacer 55, as measured at the base at which the at least one spacer 55 contacts the buried etch-resistant dielectric layer 12L, can be from 20 nm to 200 nm, and typically from 40 nm to 100 nm, although lesser and grater thicknesses can also be employed.

Figure 28:
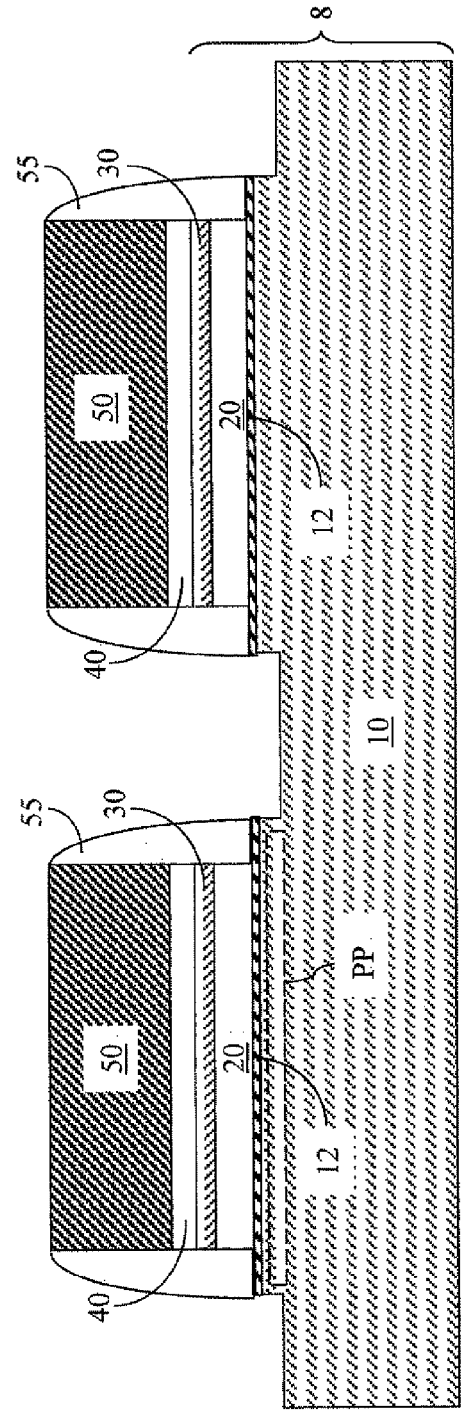

Referring to FIG. 28, exposed portion of the buried etch-resistant dielectric layer 12L and at least one upper portion of the handle substrate 10 are removed by an etch employing the at least one spacer 55 and the etch mask layer 50 as an etch mask. Sidewalls of each pedestal portion PP are vertically coincident with outermost surfaces of the at least one spacer 55.

Figure 29:
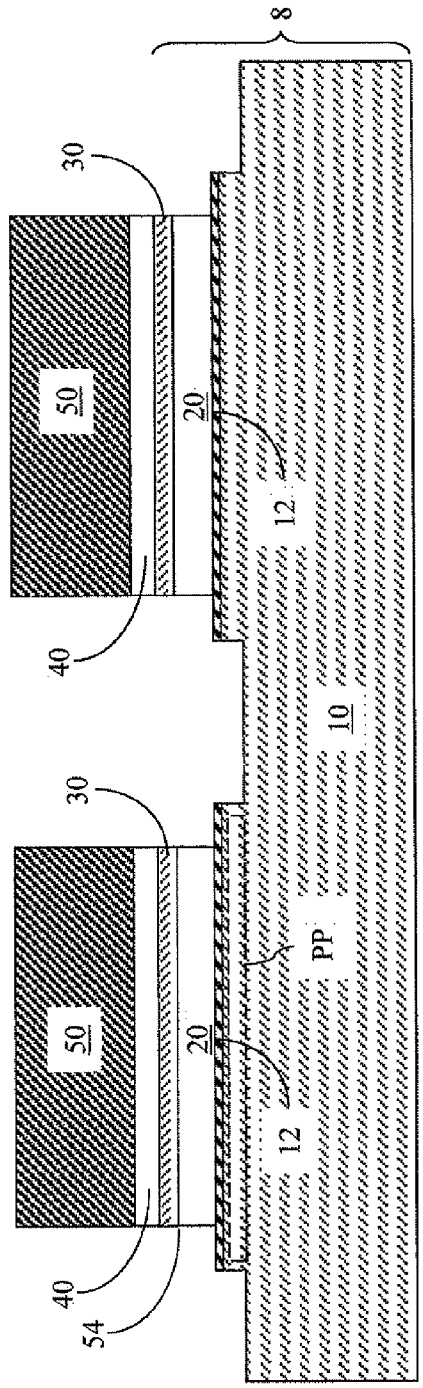

Referring to FIG. 29, the at least one spacer 55 is removed selective to the material of the at least one semiconductor material portion 30. The sidewalls of the at least one semiconductor material portion 30 are recessed inward relative to sidewalls of an underlying pedestal portion PP of the handle substrate 10.

Figure 30:
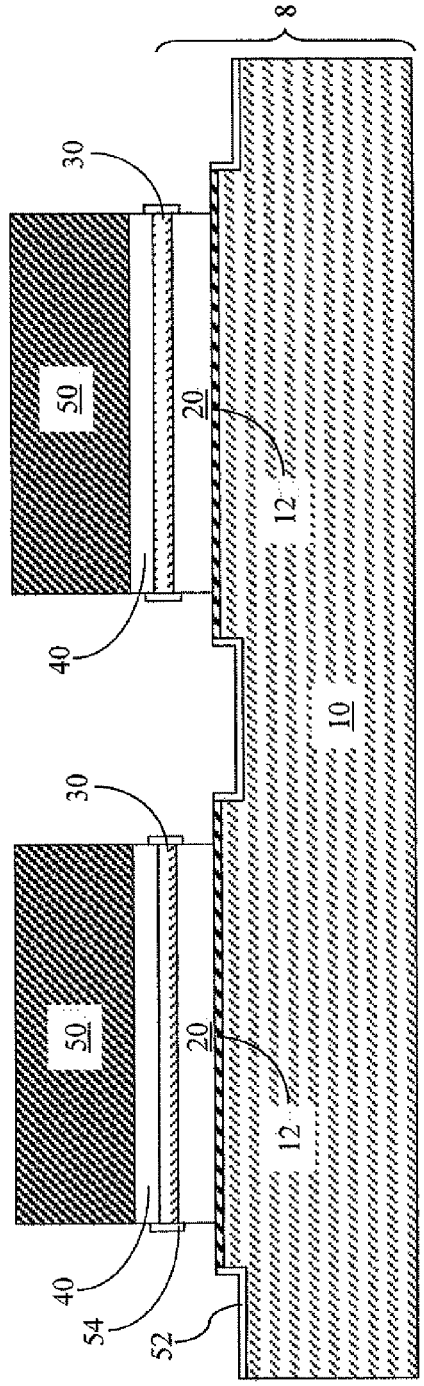

Referring to FIG. 30, a dielectric oxide-containing layer 52 is formed on exposed surfaces of the handle substrate 10 and at least one dielectric oxide-containing portion 54 is formed on exposed surfaces of each of the at least one semiconductor material portions 30 in the same manner as in the second embodiment. The exposed portions of the buried etch-resistant dielectric 12 increases the distance between the sidewalls of the at least one buried insulator portion 20 and the dielectric oxide-containing layer 52 compared to the third exemplary semiconductor structure shown in FIG. 21. The dielectric oxide-containing layer 52 does not contact any of the at least one buried insulator portion 20. Portions of sidewalls of the at least one buried insulator portion 20 and at least one dielectric oxide portion 40 are exposed after formation of the dielectric oxide-containing layer 52 and the at least one dielectric oxide-containing portion 54. The sidewalls of the at least one semiconductor material portion 30 are located in positions that are laterally recessed relative to sidewalls of the at least one pedestal portion PP of the handle substrate 10. The sidewalls of the at least one pedestal portion PP are adjoined to an upper surface of the handle substrate 10, i.e., adjoined to the interface between the handle substrate 10 and the at least one etch-resistant dielectric portion 12.

Figure 31:
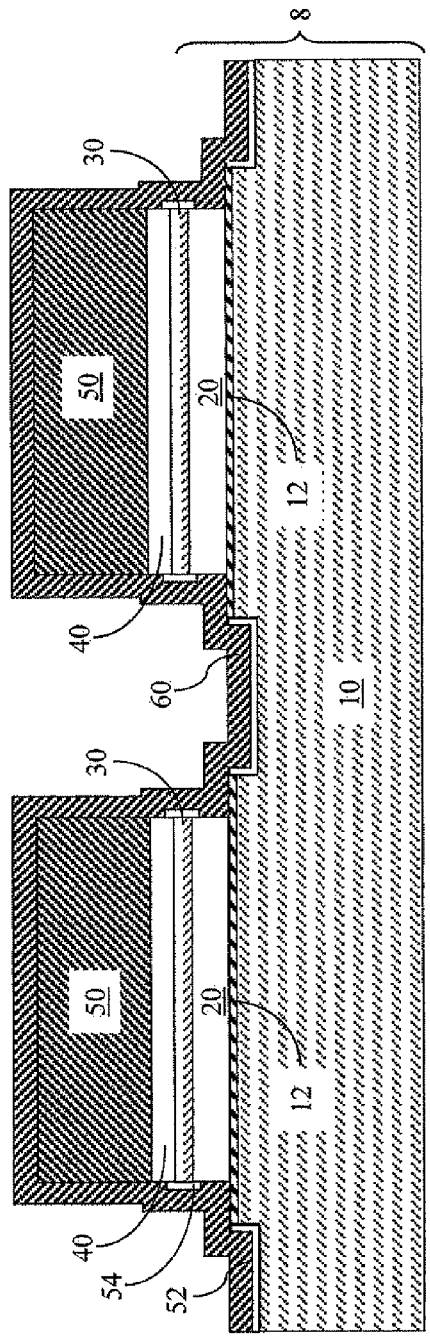

Referring to FIG. 31, a dielectric material layer 60 is formed directly on exposed surfaces of the at least one etch-resistant dielectric portion 12, sidewalls of the at least one buried insulator portion 20, sidewalls of the at least one dielectric oxide portion 40, surfaces of the dielectric oxide-containing layer 52, surfaces of the at least one dielectric oxide-containing portion 54, and the surfaces of the etch mask layer 50 in the same manner as in the second embodiment. The dielectric material layer 60 does not underlie a peripheral portion of the at least one semiconductor material portion 30.

Figure 32:
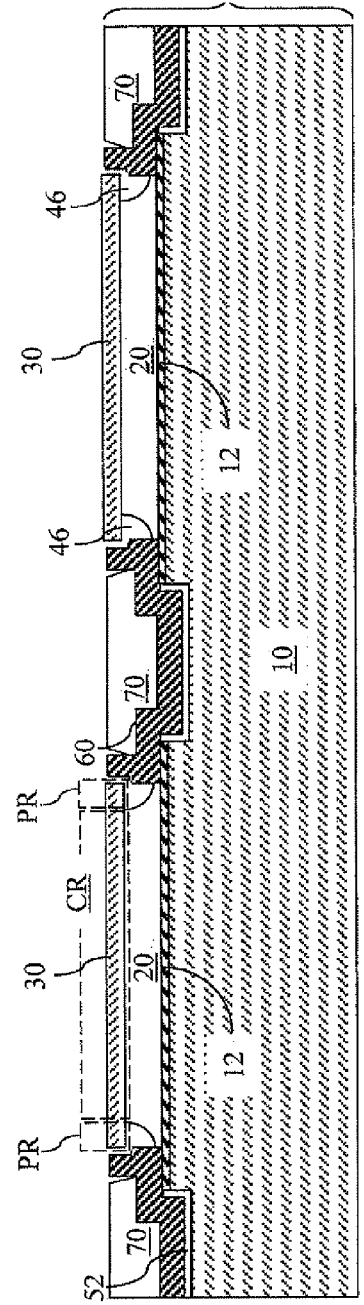

Referring to FIG. 32, processing steps corresponding to the processing steps of FIGS. 17-19 of the second embodiment are performed. Peripheral portions of the top surface of each of the at least one etch-resistant dielectric portion 12 vertically contacts a horizontal surface of the dielectric material layer 60. The at least one etch-resistant dielectric portion 12 and the dielectric material layer 60 collectively form a contiguous layer that separates the handle substrate 10 from the at least one buried insulator portion 20 and the at least one STI structure 70. Further, the contiguous layer including at least one etch-resistant dielectric portion 12 and the dielectric material layer 60 protects the handle substrate 10 from any etch that may remove a portion of the at least one buried insulator portion 20 and/or the at least one STI structure 70.

In the fourth exemplary semiconductor structure, there is no overlap between the peripheral region PR of a semiconductor material portion 30 and the dielectric material layer 60. The presence of the at least one etch-resistant dielectric portion 12 provides protection against exposure of the material of the handle substrate 10 because the material of the at least one etch-resistant dielectric portion 12 is resistant to hydrofluoric acid even if the at least one cavity 46 reaches a top surface of the at least one etch-resistant dielectric portion 12. Further, the outward lateral extension of the at least one etch-resistant dielectric portion 12 outside the area(s) of the sidewalls of the at least one semiconductor material portion 30 and the physical contact between peripheral upper surfaces of the at least one etch-resistant dielectric portion 12 and a lower surface of the dielectric material layer 60 provide an additional protection of the handle substrate 10 from the encroachment of the at least one cavity 46.

Figure 33:
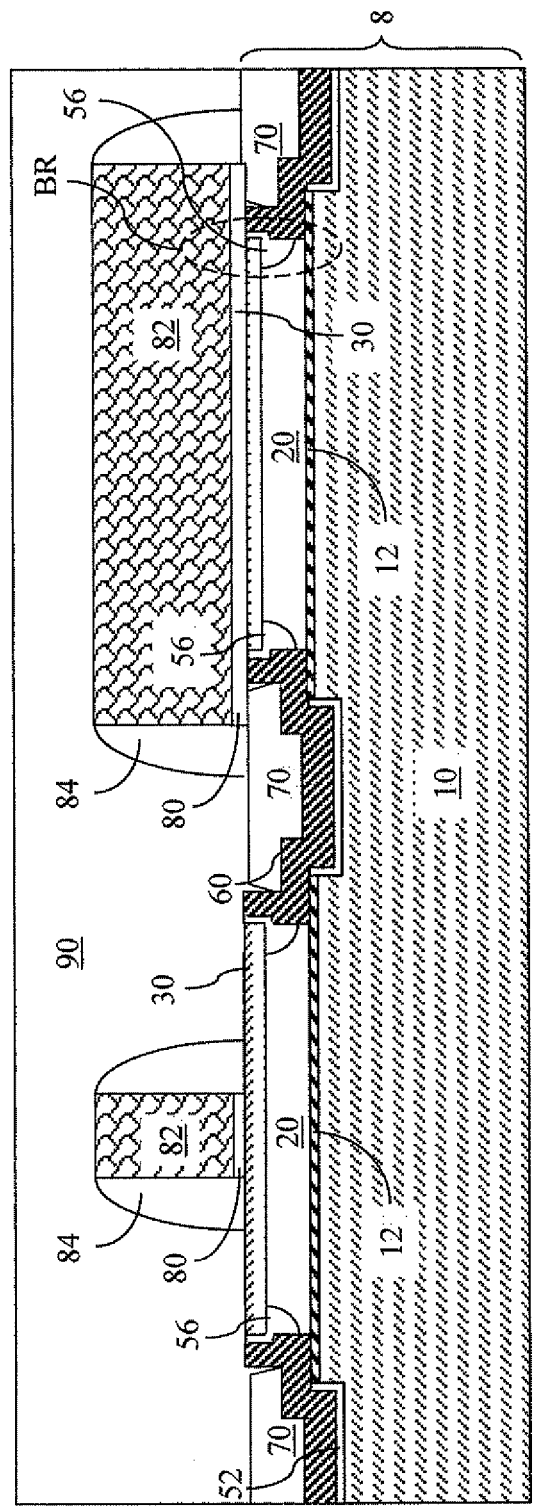

Referring to FIG. 33, gate dielectrics 80 and gate electrodes 82 are formed on the upper surface(s) of the at least one semiconductor material portion 30 as in the second embodiment. Source and drain regions (not shown), optional dielectric gate spacers 84, a contact-level dielectric layer 90, and/or a backside contact structure (not shown) can be formed as in the second embodiment.

The fourth exemplary semiconductor structure is a modification of the third exemplary semiconductor structure in which at least one etch-resistant dielectric portion 12 extends outside the area(s) of the sidewalls of the at least one semiconductor material portion 30, thereby enabling the physical contact between peripheral upper surfaces of the at least one etch-resistant dielectric portion 12 and a lower surface of the dielectric material layer 60. The at least one etch-resistant dielectric portion 12 and the dielectric material layer 60 contains the extent of the at least one divot region 56 above the upper surface(s) of the at least one etch-resistant dielectric portion 12.

Figure 34:
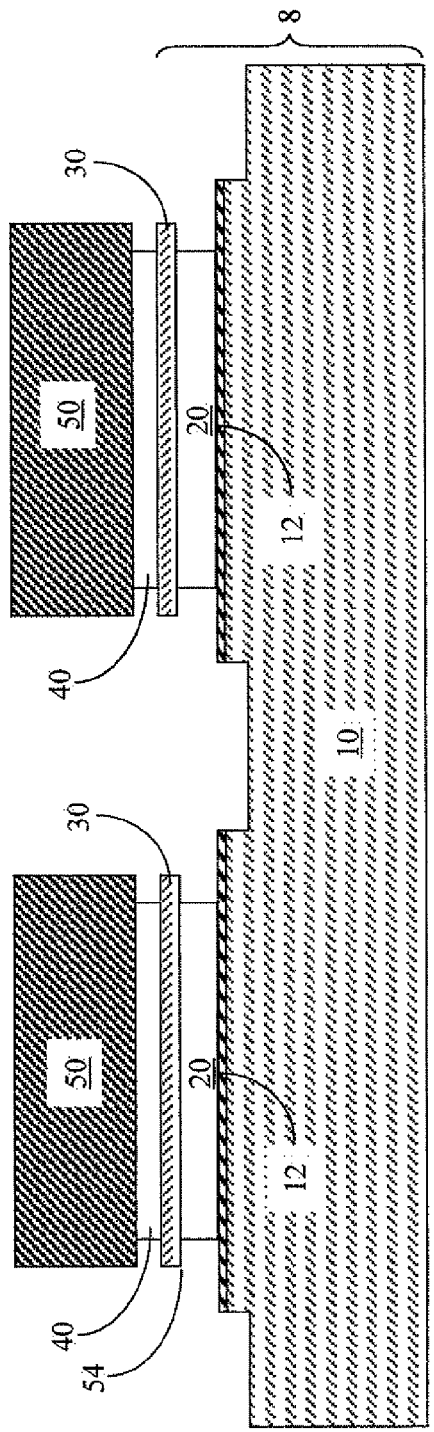
FIGS. 34-36 are sequential vertical cross-sectional views of a fifth exemplary semiconductor structure according to a fifth embodiment of the present invention.

Referring to FIG. 34, a fifth exemplary semiconductor structure according to a fifth embodiment of the present invention is derived from the fourth exemplary semiconductor structure of FIG. 29 by laterally recessing the at least one buried insulator portion 20 and the at least one dielectric oxide portion 40 employing the processing step of FIG. 14 of the second embodiment.

Figure 35:
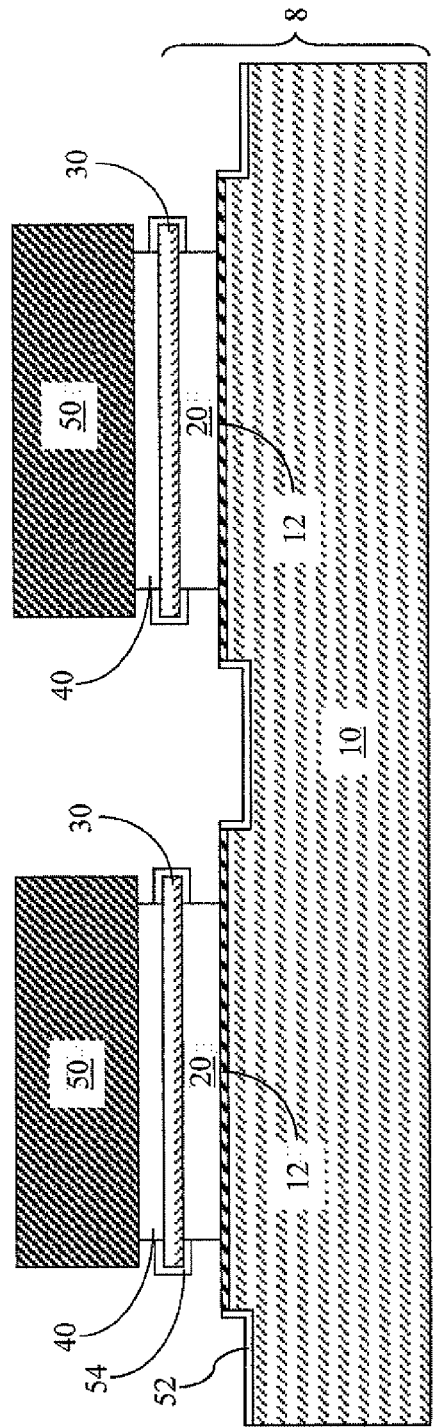

Referring to FIG. 35, the processing step of FIG. 30 of the fourth embodiment is performed to form a dielectric oxide-containing layer 52 on exposed surfaces of the handle substrate 10 and to form a dielectric oxide-containing portion 54 on exposed surfaces of each of the at least one semiconductor material portions 30.

Figure 36:
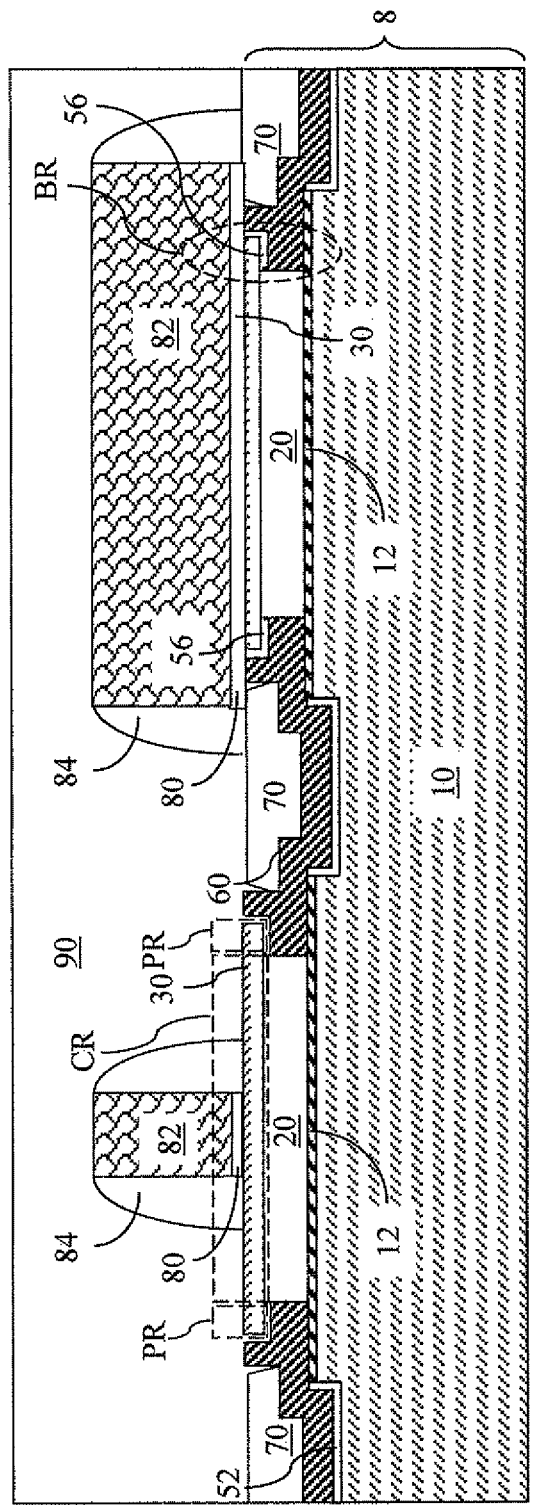

Referring to FIG. 36, the processing steps of FIGS. 31-33 of the fourth embodiment are performed. In the fifth exemplary semiconductor structure, each peripheral region PR of a semiconductor material portion 30 overlaps a portion of the dielectric material layer 60. In addition to the protection mechanisms that limit the extent of the at least one divot region above the upper surface of the at least one etch-resistant dielectric portion 12 in the fourth exemplary semiconductor structure of FIG. 33, another protection mechanism is provided by the lateral offset between the sidewalls of the at least one semiconductor material layer 30 and the sidewalls of the at least one buried insulator layer 20 as in the first exemplary semiconductor structure of FIG. 10. The two protection mechanisms are employed in the fifth exemplary semiconductor structure to reduce the degree of the intrusion of the at least one divot region 56 into the at least one buried insulator portion 20.

The first through fifth exemplary semiconductor structures limit the extent of the at least one divot region 56 above upper surface(s) of the handle substrate 10 so that the at least one divot region 56 does not extend to or contact any portion of the handle substrate 10. The limitation of the extent of the at least one divot region 56 prevents an electrical short at a boundary region BR, i.e., in the region in which a gate electrode 82 overlies a divot region 56 in which a conductive material of a gate electrode 82 can be trapped.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a handle substrate comprising a first semiconductor material;
   a buried insulator portion in contact with an upper surface of said handle substrate;
   a semiconductor material portion comprising a second semiconductor material located on an upper surface of said buried insulator portion; and
   a dielectric material layer contacting and laterally surrounding sidewalls of said buried insulator portion and extending below a plane of a bottommost surface of said buried insulator portion, wherein a peripheral region of said semiconductor material portion laterally enclosing a center region of said semiconductor material portion overlies a portion of said dielectric material layer.

2. The semiconductor structure of claim 1, further comprising a dielectric oxide-containing layer comprising an oxide or an oxynitride of said first semiconductor material, wherein said dielectric material layer is spaced from said handle substrate by said dielectric oxide-containing layer.

3. The semiconductor structure of claim 1, further comprising at least one shallow trench isolation (STI) structure laterally spaced from said buried insulator portion and said semiconductor material portion by said dielectric material layer and vertically spaced from said handle substrate by a dielectric oxide-containing layer and said dielectric material layer.

4. The semiconductor structure of claim 1, wherein said dielectric material layer includes at least one material selected from a dielectric nitride of a semiconductor element and a dielectric metal oxide.

5. The semiconductor structure of claim 1, wherein sidewalls of said buried insulator portion are recessed inward relative to sidewalls of said semiconductor material portion.

6. The semiconductor structure of claim 1, further comprising:
  a gate electrode located above said semiconductor material portion; and
  a backside contact via structure that contacts said handle substrate and extending above a horizontal plane of an upper surface of said semiconductor material portion.

7. A semiconductor structure comprising:
  a handle substrate comprising a first semiconductor material;
  a buried etch-resistant dielectric portion located on an upper surface of said handle substrate;
  a buried insulator portion located on said buried etch-resistant dielectric portion;
  a semiconductor material portion comprising a second semiconductor material located on an upper surface of said buried insulator portion; and
  a dielectric material layer contacting and laterally surrounding said buried etch-resistant dielectric portion and extending from above, and to below, a plane of a bottommost surface of said buried insulator portion.

8. The semiconductor structure of claim 7, wherein said dielectric material layer extends at least above an interface between said buried insulator portion and said semiconductor material portion.

9. The semiconductor structure of claim 7, further comprising a dielectric oxide-containing layer comprising an oxide or an oxynitride of said first semiconductor material, wherein said dielectric material layer is spaced from said handle substrate by said dielectric oxide-containing layer.

10. The semiconductor structure of claim 9, further comprising at least one shallow trench isolation (STI) structure laterally spaced from said buried insulator portion and said semiconductor material portion by said dielectric material layer and vertically spaced from said handle substrate by said dielectric oxide-containing layer and said dielectric material layer.

11. The semiconductor structure of claim 7, wherein said dielectric material layer includes at least one material selected from a dielectric nitride of a semiconductor element, a dielectric metal nitride, and a dielectric metal oxide.

12. The semiconductor structure of claim 7, wherein sidewalls of said buried insulator layer are recessed inward relative to sidewalls of said semiconductor material portion.

13. The semiconductor structure of claim 12, wherein said sidewalls of said semiconductor material portion are vertically coincident with sidewalls of said handle substrate adjoined to an upper surface of said handle substrate.

14. The semiconductor structure of claim 12, wherein said sidewalls of said semiconductor material portion are recessed inward relative to sidewalls of said handle substrate adjoined to an upper surface of said handle substrate.

* * * * *